(12) United States Patent
Chiu et al.

(10) Patent No.: US 12,161,056 B2
(45) Date of Patent: Dec. 3, 2024

(54) MEMORY STRUCTURE

(71) Applicant: Taiwan Semiconductor Manufacturing Company, Ltd., Hsin-Chu (TW)

(72) Inventors: Chieh-Fei Chiu, Tainan (TW); Wen-Ting Chu, Kaohsiung (TW); Yong-Shiuan Tsair, Tainan (TW); Yu-Wen Liao, New Taipei (TW); Chin-Yu Mei, Hsin-Chu (TW); Po-Hao Tseng, Hsin-Chu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 514 days.

(21) Appl. No.: 17/411,485

(22) Filed: Aug. 25, 2021

(65) Prior Publication Data

US 2021/0384421 A1     Dec. 9, 2021

Related U.S. Application Data

(63) Continuation of application No. 16/601,800, filed on Oct. 15, 2019, now Pat. No. 11,107,982.

(51) Int. Cl.
*H10N 70/00* (2023.01)
*H01L 23/31* (2006.01)
(Continued)

(52) U.S. Cl.
CPC ..... *H10N 70/8265* (2023.02); *H01L 23/3114* (2013.01); *H01L 23/481* (2013.01); *H01L 23/4952* (2013.01); *H10N 70/841* (2023.02)

(58) Field of Classification Search
CPC ............... H01L 23/3114; H01L 23/481; H01L 23/4952; H10B 63/30; H10N 70/063;
(Continued)

(56) References Cited

U.S. PATENT DOCUMENTS 8,872,149 B1   10/2014   Hsieh et al.
8,916,434 B2   12/2014   Sun et al.
(Continued)

OTHER PUBLICATIONS

Non-Final Office Action dated Oct. 2, 2020 for U.S. Appl. No. 16/601,800.

(Continued)

*Primary Examiner* — Britt D Hanley
*Assistant Examiner* — Kevin Quinto
(74) *Attorney, Agent, or Firm* — Eschweiler & Potashnik, LLC

(57) ABSTRACT

The present disclosure, in some embodiments, relates to an integrated chip. The integrated chip includes a memory device arranged over an etch stop material over a substrate. The memory device includes a data storage structure disposed between a bottom electrode and a top electrode. A first interconnect via contacts an upper surface of the bottom electrode and a second interconnect via contacts an upper surface of the top electrode. An interconnect wire contacts a top of the first interconnect via. A third interconnect via contacts a bottom of the interconnect wire and extends through the etch stop material to a plurality of lower interconnects below the etch stop material.

20 Claims, 14 Drawing Sheets

(51) Int. Cl.
  *H01L 23/48* (2006.01)
  *H01L 23/495* (2006.01)
(58) Field of Classification Search
  CPC .... H10N 70/20; H10N 70/821; H10N 70/826; H10N 70/8265; H10N 70/841; H10N 70/881
  See application file for complete search history.

(56) References Cited

U.S. PATENT DOCUMENTS

| | | | |
|---|---|---|---|
| 10,163,981 B2 | 12/2018 | Chen et al. | |
| 10,461,126 B2 | 10/2019 | Tsai et al. | |
| 10,504,963 B2 | 12/2019 | Yang et al. | |
| 2001/0025995 A1* | 10/2001 | Lee | H01L 29/4941 257/E21.199 |
| 2002/0149041 A1 | 10/2002 | Lee | |
| 2007/0034988 A1 | 2/2007 | Won et al. | |
| 2008/0073685 A1 | 3/2008 | Wang | |
| 2013/0026585 A1 | 1/2013 | Sung et al. | |
| 2013/0237028 A1 | 9/2013 | Furuhashi | |
| 2013/0300003 A1* | 11/2013 | Sun | H01L 28/40 257/E23.116 |
| 2014/0203236 A1* | 7/2014 | Chen | H10B 63/30 257/4 |
| 2016/0225986 A1 | 8/2016 | Hsu et al. | |
| 2019/0214558 A1 | 7/2019 | Ando et al. | |
| 2019/0259943 A1 | 8/2019 | Ando et al. | |

OTHER PUBLICATIONS

Notice of Allowance dated Apr. 29, 2021 for U.S. Appl. No. 16/601,800.

* cited by examiner

MEMORY STRUCTURE

REFERENCE TO RELATED APPLICATION

This Application is a Continuation of U.S. application Ser. No. 16/601,800, filed on Oct. 15, 2019, the contents of which are hereby incorporated by reference in their entirety.

BACKGROUND

Many modern day electronic devices contain electronic memory configured to store data. Electronic memory may be volatile memory or non-volatile memory. Volatile memory stores data when it is powered, while non-volatile memory is able to store data when power is removed. Resistive random-access memory (RRAM) devices are one promising candidate for a next generation non-volatile memory technology. This is because RRAM devices provide for many advantages, including a fast write time, high endurance, low power consumption, and low susceptibility to damage from radiation.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
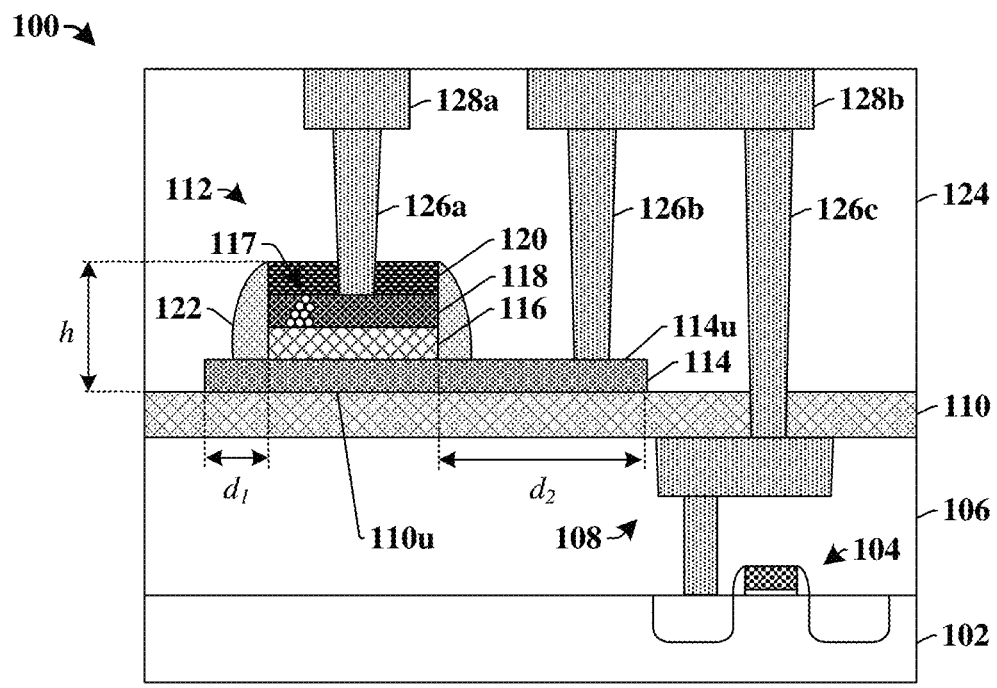
FIG. 1 illustrates a cross-sectional view of some embodiments of an integrated chip having a RRAM device comprising bottom and top electrodes coupled to overlying interconnect vias.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower." "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Many modern day integrated chips have embedded memory arrays that are disposed on a same integrated chip die as logic devices. Resistive random access memory (RRAM) devices are one type of memory device that can be easily integrated into an integrated chip as embedded memory. This is because RRAM devices are usually disposed within a back-end-of-the-line (BEOL) interconnect stack, so that they do not consume a large area of a semiconductor material on an integrated chip die. For example, RRAM devices can be arranged on an interconnect layer (e.g., an interconnect via layer) within an embedded memory region, while the same interconnect layer may be used for routing between logic devices within an adjacent logic region.

RRAM devices typically comprise a data storage layer disposed between a bottom electrode and a top electrode. The bottom electrode may be coupled to an underlying interconnect layer by way of a bottom electrode via, while the top electrode may be coupled to an overlying interconnect layer by way of a top electrode via. The bottom electrode via extends through a layer of dielectric material (e.g., silicon carbide) that underlies the bottom electrode. To maintain a good process window for the bottom electrode via the layer of dielectric material may have a height of between 300 angstroms and 500 angstroms, resulting an overall height of an RRAM device that may be greater than 1000 angstroms.

As the size of integrated chip components scales, both the lateral and vertical dimensions of interconnect layers within a BEOL interconnect stack decrease. For example, from one technology node to a next technology node, a height of an interconnect via layer (e.g., a V3 layer) may shrink by between 20% and 30%. Because RRAM devices are disposed within a BEOL interconnect stack, a failure to reduce a height of RRAM devices can cause step height issues (e.g., poor lithographic focus over a reticle field) between an embedded memory region and an adjacent logic region. The step height issues may lead to process window problems in overlying interconnect layers, which can lower yield and/or reliability of an integrated chip.

The present disclosure, in some embodiments, relates to an RRAM device that achieves a relatively small height (e.g., between 600 angstroms and 800 angstroms) by not having a bottom electrode via contact an overlying bottom electrode of the RRAM device. In some embodiments, the disclosed RRAM device comprises a data storage structure disposed between a bottom electrode and a top electrode. A first interconnect via contacts an upper surface of the top electrode and a second interconnect via contacts an upper surface of the bottom electrode. By contacting upper surfaces of both the bottom electrode and the top electrode with overlying interconnect vias, a height of the RRAM device is able to be reduced, thereby mitigating process window problems in overlying interconnect layers.

FIG. 1 illustrates a cross-sectional view of some embodiments of an integrated chip 100 having an RRAM device comprising bottom and top electrodes coupled to overlying interconnect vias.

The integrated chip 100 comprises an access device 104 arranged within a substrate 102. In some embodiments, the access device 104 may comprise a transistor device (e.g., a MOSFET, a bi-polar junction transistor (BJT), a high electron mobility transistor (HEMT), or the like). In some embodiments, the substrate 102 may comprise a semiconductor material (e.g., silicon, germanium, or the like). A lower inter-level dielectric (ILD) structure 106 is arranged over the substrate 102 and surrounds the access device 104. The lower ILD structure 106 further surrounds a plurality of lower interconnect layers 108, which are electrically coupled to the access device 104.

An etch stop material 110 is disposed over the lower ILD structure 106. A resistive random access memory (RRAM) device 112 is disposed over an upper surface 110u of the etch stop material 110. The upper surface 110u of the etch stop material 110 continuously extends between outermost sidewalls of the RRAM device 112. In some embodiments, an entirety of the RRAM device 112 may be above the upper surface 110u of the etch stop material 110. In some embodiments, the RRAM device 112 may directly contact the upper surface 110u of the etch stop material 110.

The RRAM device 112 comprises a data storage structure 116 arranged between a bottom electrode 114 and a top electrode 118. In some embodiments, a hard mask 120 may be disposed over the top electrode 118. The bottom electrode 114 continually extends past one or more outermost sidewalls of the data storage structure 116. In some embodiments, the bottom electrode 114 extends a first distance $d_1$ past a first outermost sidewall of the data storage structure 116 and a second distance $d_2$ past an opposing second outermost sidewall of the data storage structure 116. In some such embodiments, the second distance $d_2$ is greater than the first distance $d_1$. In some embodiments, the first distance $d_1$ may be in a first range of between approximately 0 nm and approximately 60 nm. In some embodiments, the second distance $d_2$ may be in a second range of between approximately 10 nm and approximately 100 nm. In some embodiments, sidewall spacers 122 are disposed over the bottom electrode 114 and along sidewalls of the data storage structure 116, the top electrode 118, and the hard mask 120.

The data storage structure 116 is configured to store different data states by undergoing reversible changes between a high resistive state associated with a first data state (e.g., a '0') and a low resistive state associated with a second data state (e.g., a '1'). For example, during operation, to achieve a low resistive state within the data storage structure 116, a first set of bias conditions may be applied to the bottom electrode 114 and the top electrode 118. The first set of bias conditions drive oxygen from the data storage structure 116 to the top electrode 118, thereby forming a conductive filament 117 of oxygen vacancies across the data storage structure 116. Alternatively, to achieve a high resistive state within the data storage structure 116, a second set of bias conditions may be applied to the bottom electrode 114 and the top electrode 118. The second set of bias conditions break the conductive filament 117 by driving oxygen from the top electrode 118 to the data storage structure 116.

An upper ILD structure 124 is disposed over the etch stop material 110 and the RRAM device 112. Upper interconnect structures are disposed within the upper ILD structure 124. The upper interconnect structures comprise a first upper interconnect via 126a disposed on an upper surface of the top electrode 118 and a second upper interconnect via 126b disposed on an upper surface 114u of the bottom electrode 114. The first upper interconnect via 126a is coupled to a first interconnect wire 128a and the second upper interconnect via 126b is coupled to a second interconnect wire 128b. The second interconnect wire 128b is further coupled to a third upper interconnect via 126c, which is coupled to the access device 104 by the plurality of lower interconnect layers 108.

By contacting both the bottom electrode 114 and the top electrode 118 along upper surfaces, a height of the RRAM device 112 can be made to be relatively small (e.g., since a bottom electrode via is omitted from the device). For example, in some embodiments, the RRAM device 112 may have a height h in a range of between approximately 600 angstroms and approximately 800 angstroms. In other embodiments, the RRAM device 112 may have a height h in a range of between approximately 700 angstroms and approximately 800 angstroms. Making the height h of the RRAM device 112 relatively small prevents a step height difference between an embedded memory region and a peripheral logic region, and mitigates associated process window problems.

Figure 2:
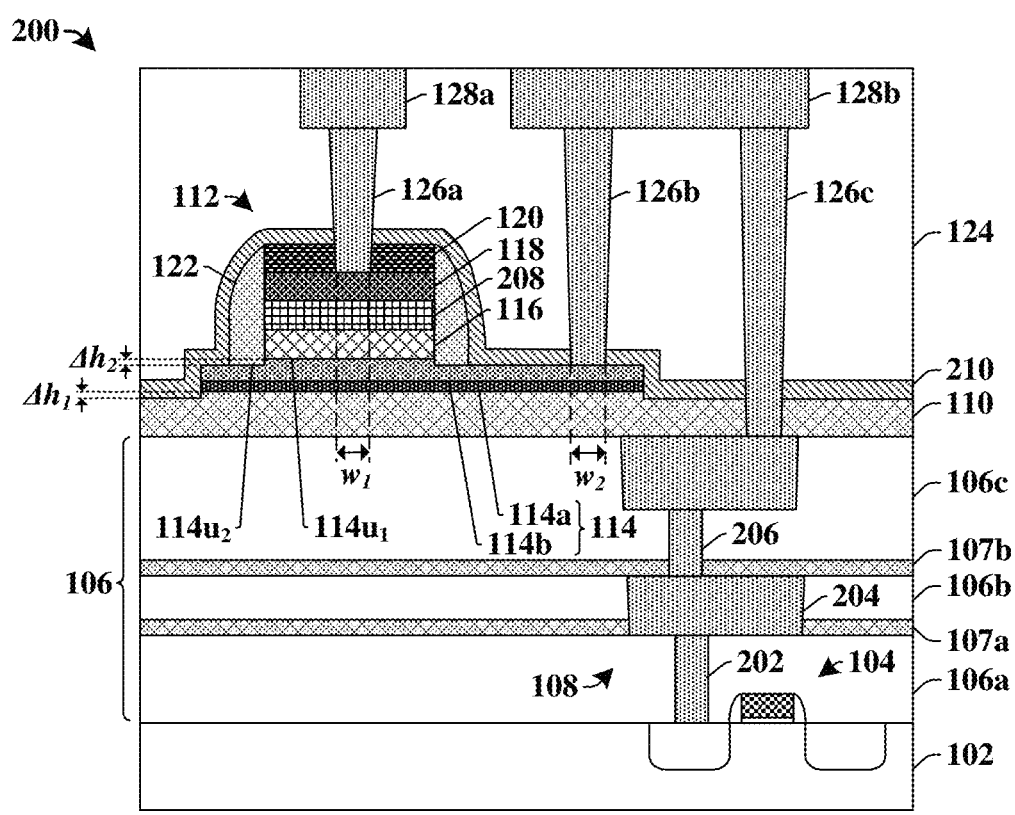
FIG. 2 illustrates a cross-sectional view of some additional embodiments of an integrated chip having an RRAM device comprising bottom and top electrodes coupled to overlying interconnect vias.

FIG. 2 illustrates a cross-sectional view of some additional embodiments of an integrated chip 200 having an RRAM device comprising bottom and top electrodes coupled to overlying interconnect vias.

The integrated chip 200 comprises a lower ILD structure 106 disposed over a substrate 102. The lower ILD structure 106 comprises a plurality of lower inter-level dielectric (ILD) layers 106a-106c stacked onto one another and separated by etch stop layers 107a-107b. In some embodiments, the plurality of lower ILD layers 106a-106c may comprise one or more of silicon dioxide, doped silicon dioxide (e.g., carbon doped silicon dioxide), silicon oxynitride, borosilicate glass (BSG), phosphoric silicate glass (PSG), borophosphosilicate glass (BPSG), fluorinated silicate glass (FSG), or the like. In some embodiments, the etch stop layers 107a-107b may comprise silicon carbide, silicon nitride, titanium nitride, tantalum nitride, or the like.

A plurality of lower interconnect layers 108 are arranged within the lower ILD structure 106. The plurality of lower interconnect layers 108 comprise conductive contacts 202, interconnect wires 204, and interconnect vias 206 respectively surrounded by one of the plurality of lower ILD layers 106a-106c. For example, the conductive contact 202 may be surrounded by a first lower ILD layer 106a, a first one of the interconnect wires 204 may be surrounded by a second lower ILD layer 106b, etc. In some embodiments, the interconnect wires 204 and the interconnect vias 206 respectively comprise a diffusion barrier layer surrounding a metal core. In some embodiments, the metal core may comprise copper, tungsten, aluminum, or the like. In some embodiments, the diffusion barrier layer may comprise titanium nitride, tantalum nitride, or the like.

An etch stop material 110 may be disposed over the plurality of lower ILD layers 106a-106c and an RRAM device 112 may be disposed over the etch stop material 110. In some embodiments, the etch stop material 110 may have a first thickness directly below the RRAM device 112 and a second thickness laterally outside of the RRAM device 112. In some embodiments, the etch stop material 110 may have a first thickness in a range of between approximately 100 angstroms and approximately 200 angstroms. In other embodiments, the etch stop material 110 may have a first thickness of approximately 150 angstroms. In some embodiments, the first thickness and the second thickness have a first height difference $\Delta h_1$. In some embodiments, the first height difference $\Delta h_1$ may be in a range of between approximately 0 angstroms and approximately 15 angstroms. In various embodiments, the etch stop material 110 may comprise one or more of silicon oxynitride, silicon dioxide, silicon carbide, silicon nitride, Tetraethyl orthosilicate (TEOS), a low-K dielectric, or the like.

The RRAM device 112 comprises a data storage structure 116 disposed between a bottom electrode 114 and a top electrode 118. The bottom electrode 114 has a first width and the data storage structure 116 has a second width that is smaller than the first width. The difference in widths between the bottom electrode 114 and the data storage structure 116 causes the bottom electrode 114 to laterally extend past one or more outermost sidewalls of the data storage structure 116. In some embodiments, the bottom electrode 114 may have a first upper surface $114u_1$ disposed directly below the data storage structure 116 and second upper surface $114u_2$ disposed laterally outside of the data storage structure 116. The first upper surface $114u_1$ and the second upper surface $114u_2$ cause the bottom electrode 114 to have a first thickness directly below the data storage structure 116 and a second thickness laterally outside of the data storage structure 116. In some embodiments, the first thickness is in a range of between approximately 200 angstroms and approximately 400 angstroms. In some embodiments, the first thickness and the second thickness have a second height difference $\Delta h_2$. In some embodiments, the second height difference $\Delta h_2$ may be in a range of between approximately 0 angstroms and approximately 15 angstroms.

In some embodiments, the bottom electrode 114 may comprise a liner 114a and a conductive material 114b overlying the liner 114a. In some embodiments, the liner 114a may comprise a metal nitride, such as titanium nitride, tantalum nitride, or the like. In some embodiments, the conductive material 114b may comprise a metal, such as titanium, tantalum, tungsten, or the like. In some embodiments, the top electrode 118 may comprise one or more of titanium, tantalum, tungsten, tantalum nitride, titanium nitride, or the like. In some embodiments, the data storage structure 116 may comprise a metal, a metal-oxynitride, or a compound-metal-oxide. For example, in various embodiments, the data storage structure 116 may comprise hafnium oxide, zirconium oxide, aluminum oxide, nickel oxide, tantalum oxide, titanium oxide, or the like.

In some embodiments, the top electrode 118 may have a thickness in a range of between approximately 150 angstroms and approximately 350 angstroms. In some embodiments, the data storage structure 116 may have a thickness in a range of between approximately 25 angstroms and approximately 100 angstroms. The thicknesses of the bottom electrode 114, the data storage structure 116, and/or the top electrode 118 prevent an overall height of the RRAM device 112 from getting large enough to present step height problems that may affect other regions of an integrated chip (e.g., a logic region) and/or overlying interconnect layers.

In some embodiments, a capping layer 208 may be disposed between the data storage structure 116 and the top electrode 118. The capping layer 208 is configured to store oxygen, which can facilitate resistive changes within the data storage structure 116. A hard mask 120 is disposed over the top electrode 118. In some embodiments, the capping layer 208 may comprise a metal (e.g., such as titanium, tantalum, hafnium, platinum, aluminum, or the like) or a metal oxide (e.g., such as titanium oxide, hafnium oxide, zirconium oxide, germanium oxide, cesium oxide, or the like).

Sidewall spacers 122 are disposed along opposing sides of the top electrode 118 and the hard mask 120. In some embodiments, the sidewall spacers 122 are disposed directly over the second upper surface $114u_2$ of the bottom electrode 114. In other embodiments (not shown), the sidewall spacers 122 may be disposed directly over the first upper surface $114u_1$ of the bottom electrode 114. In some embodiments, the sidewall spacers 122 may comprise a same material as the hard mask 120. For example, in some embodiments the hard mask 120 and the sidewall spacers 122 may comprise a carbide (e.g., silicon carbide), a nitride (e.g., silicon nitride), an oxide (e.g., silicon oxy-nitride), or the like. In other embodiments, the sidewall spacers 122 may comprise a different material than the hard mask 120.

A protective layer 210 is disposed over the sidewall spacers 122 and the hard mask 120. The protective layer 210 continuously extends from over the hard mask 120 to the etch stop material 110. In some embodiments, the protective layer 210 contacts the bottom electrode 114 on opposing sides of the data storage structure 116. In some embodiments, the protective layer 210 may comprise a carbide, an oxide, a nitride, TEOS, or the like. In some embodiments, the protective layer 210 may be a same material (e.g., silicon carbide, silicon nitride, or the like) as the etch stop material 110. In such embodiments, a material of the etch stop material 110 may extend to an upper surface that is vertically between a bottom and a top of the bottom electrode 114.

An upper ILD structure 124 is arranged over the protective layer 210. Upper interconnect vias 126a-126c and upper interconnect wires 128a-128b are disposed within the upper ILD structure 124. The upper interconnect vias 126a-126c and upper interconnect wires 128a-128b extend from an upper surface of the upper ILD structure 124 to the top electrode 118 and the bottom electrode 114. In some embodiments, the upper ILD structure 124 may comprise a carbon doped silicon dioxide, silicon oxynitride, BSG, PSG, BPSG, FSG, a porous dielectric material, or the like. In various embodiments, the upper interconnect vias 126a-126c and upper interconnect wires 128a-128b may comprise a conductive material, such as copper, tungsten, and/or aluminum.

In some embodiments, the upper interconnect vias 126a-126c may comprise a first upper interconnect via 126a contacting the top electrode 118 and a second upper interconnect via 126b contacting the bottom electrode 114. In some embodiments, the first upper interconnect via 126a has a bottom surface that contacts the top electrode 118 and that has a first width $w_1$. In some embodiments, the second upper interconnect via 126b has a bottom surface that contacts the bottom electrode 114 and that has a second width $w_2$. In some embodiments, the first width $w_1$ is larger than the second width $w_2$.

Figure 3A:
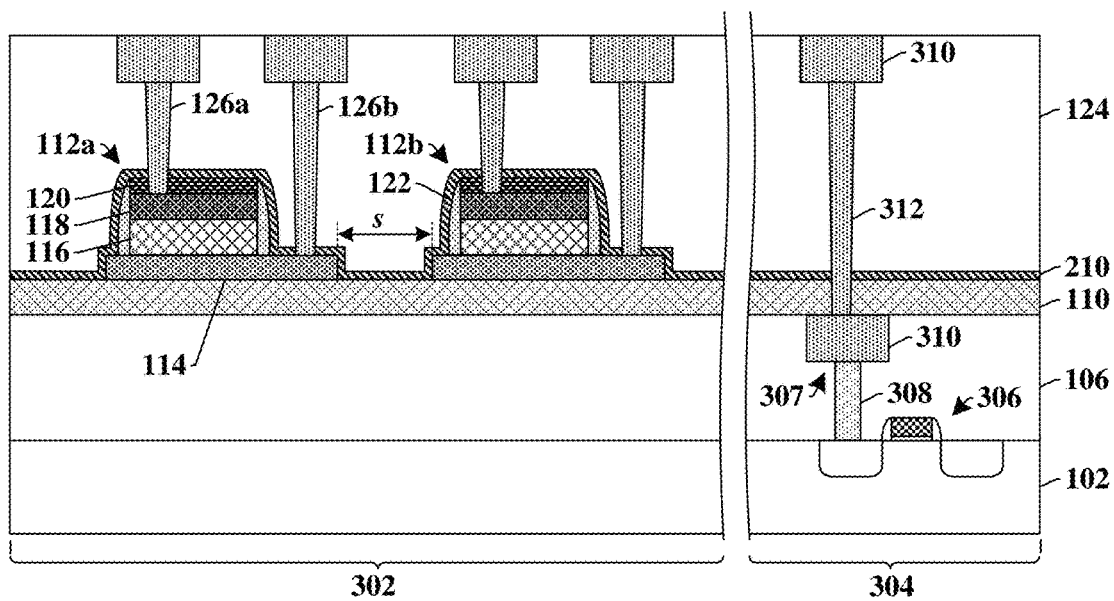
FIGS. 3A-3B illustrate some additional embodiments of an integrated chip having an RRAM device comprising bottom and top electrodes coupled to overlying interconnect vias.
Figure 3B:
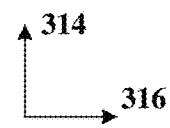
Figure 3B:
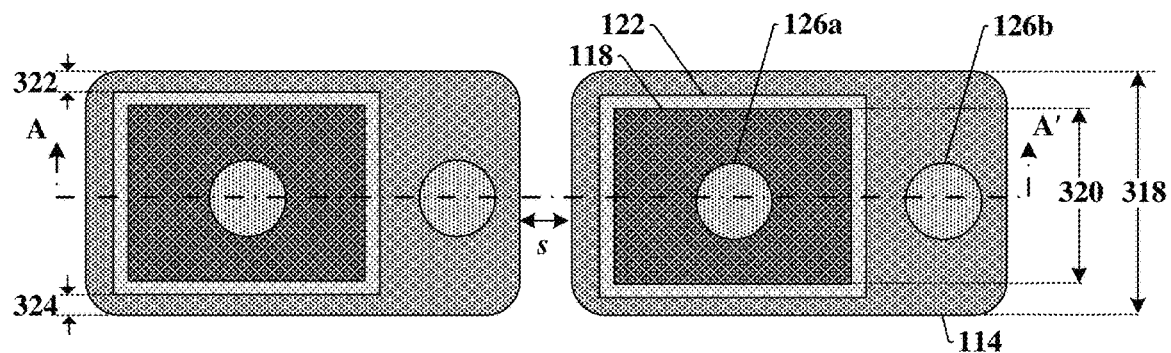

FIGS. 3A-3B illustrate some additional embodiments of an integrated chip having an RRAM device comprising bottom and top electrodes coupled to overlying interconnect vias.

As shown in cross-sectional view 300A of FIG. 3A, the integrated chip comprises a substrate 102 including an embedded memory region 302 and a logic region 304. Within the embedded memory region 302, RRAM devices 112a-112b are arranged over an etch stop material 110. The RRAM devices 112a-112b respectively comprise a data storage structure 116 disposed between a bottom electrode 114 and a top electrode 118. The bottom electrode 114 of adjacent ones of the RRAM devices 112a-112b may be separated by a space s. In some embodiments, the space s is in a range of between approximately 2 nm and approximately 100 nm. In other embodiments, the space s may be greater than 100 nm.

Within the logic region 304, a logic device 306 is arranged within the substrate 102. In some embodiments, the logic device 306 may comprise a transistor device (e.g., a MOSFET, a BJT, a HEMT, or the like). One or more additional interconnect layers 307 are coupled to the logic device 306. The one or more additional interconnect layers 307 comprise a conductive contact 308, an interconnect wire 310, and an interconnect via 312.

FIG. 3B illustrates a top-view of the RRAM devices 112a-112b of FIG. 3A (FIG. 3A is taken along cross-sectional line A-A' of FIG. 3B). For simplicity of understanding the top-view of the RRAM devices 112a-112b shown in FIG. 3B omits layers other than the bottom electrode 114, the top electrode 118, the sidewall spacer 122, and the upper interconnect vias 126a-126b.

As shown in top view 300B, the sidewall spacer 122 continuously extends around outermost sidewalls of the top electrode 118 in an unbroken ring. In some embodiments, the bottom electrode 114 may have a first width 318 along a first direction 314 and the top electrode 118 may have a second width 320 along the first direction 314. In some embodiments, the second width 320 may be smaller than the first width 318. In some embodiments, the bottom electrode 114 continuously extends past opposing sides of the sidewall spacer 122 along the first direction 314 and along a second direction 316 that is perpendicular to the first direction 314.

In some embodiments, the bottom electrode 114 may extend past opposing outermost sidewalls of the sidewall spacer 122 along the first direction 314 for a first distance 322 and a second distance 324, respectively. In some embodiments, the first distance 322 may be substantially equal to the second distance 324. In other embodiments, the first distance 322 may be different than the second distance 324.

Figure 4A:
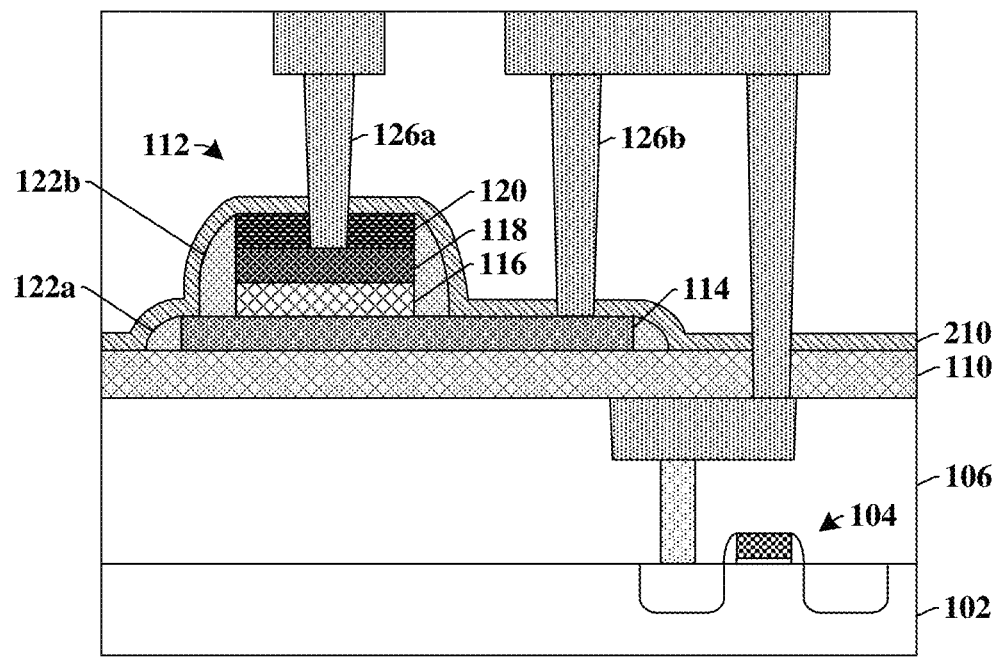
FIGS. 4A-4B illustrate some additional embodiments of an integrated chip having an RRAM device comprising bottom and top electrodes coupled to overlying interconnect vias.
Figure 4B:
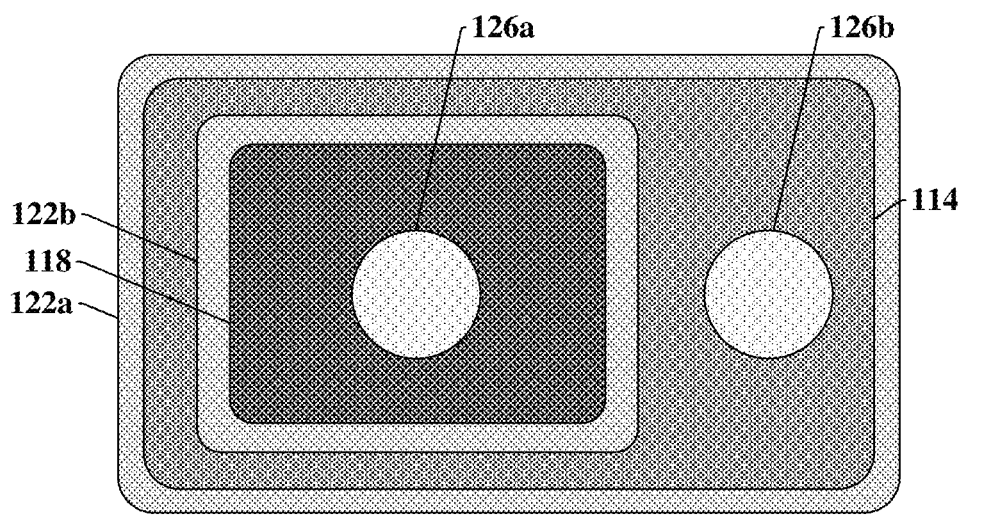

FIGS. 4A-4B illustrate some additional embodiments of an integrated chip having an RRAM device comprising bottom and top electrodes coupled to overlying interconnect vias.

As shown in cross-sectional view 400A of FIG. 4A, the integrated chip comprises an RRAM device 112 disposed on an etch stop material 110 over a substrate 102. The RRAM device 112 comprises a data storage structure 116 disposed between a bottom electrode 114 and a top electrode 118. A first sidewall spacer 122a is disposed along sidewalls of the bottom electrode 114. A second sidewall spacer 122b is disposed along sidewalls of the top electrode 118. The bottom electrode 114 extends past outermost sidewalls of the second sidewall spacer 122b, so that the first sidewall spacer 122a is laterally separated from the second sidewall spacer 122b. In some embodiments, the first sidewall spacer 122a has a height that is substantially equal to a height of the bottom electrode 114 and the second sidewall spacer 122b has a height that extends from a bottom of the data storage structure 116 to a top of a hard mask 120 over the top electrode 118.

A protective layer 210 is disposed over both the first sidewall spacer 122a and the second sidewall spacer 122b. In some embodiments (not shown), the first sidewall spacer 122a may continuously extend between sidewalls of bottom electrodes within adjacent RRAM devices. In other embodiments, the first sidewall spacer 122a disposed along the sidewalls of bottom electrodes within adjacent RRAM devices may be separated by the protective layer 210 and/or by an upper ILD structure 124 disposed over the protective layer 210.

As shown in top view 400B of FIG. 4B, the first sidewall spacer 122a continuously extends around outermost sidewalls of the bottom electrode 114 in a first unbroken ring, and the second sidewall spacer 122b continuously extends around outermost sidewalls of the top electrode 118 in a second unbroken ring. The first sidewall spacer 122a is separated from the second sidewall spacer 122b along a first direction 314 and along a second direction 316 that is perpendicular to the first direction 314.

Figure 5A:
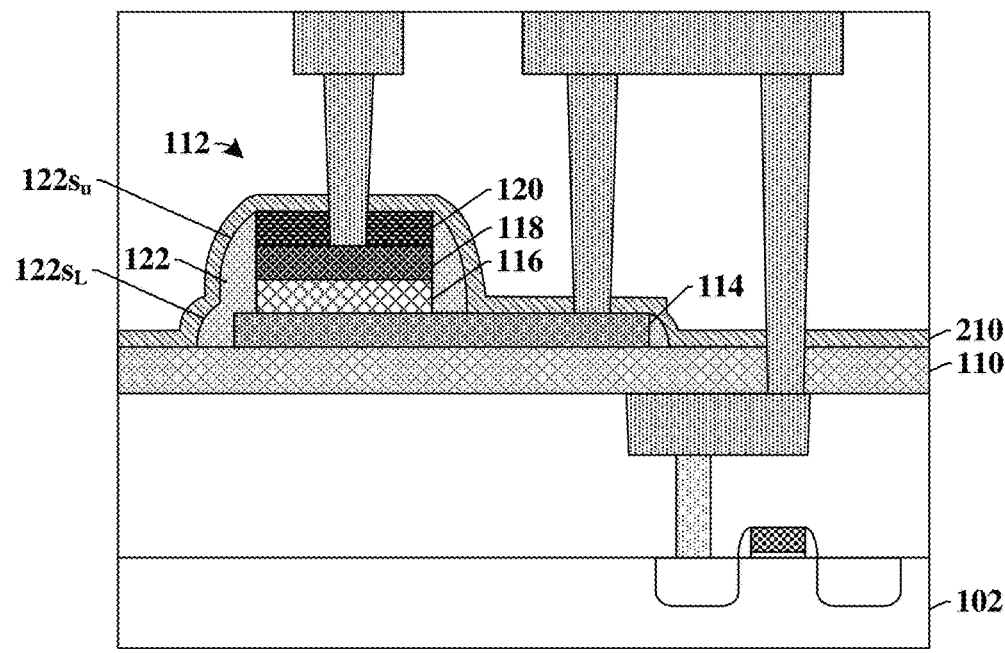
FIGS. 5A-5B illustrate some additional embodiments of an integrated chip having an RRAM device comprising bottom and top electrodes coupled to overlying interconnect vias.
Figure 5B:
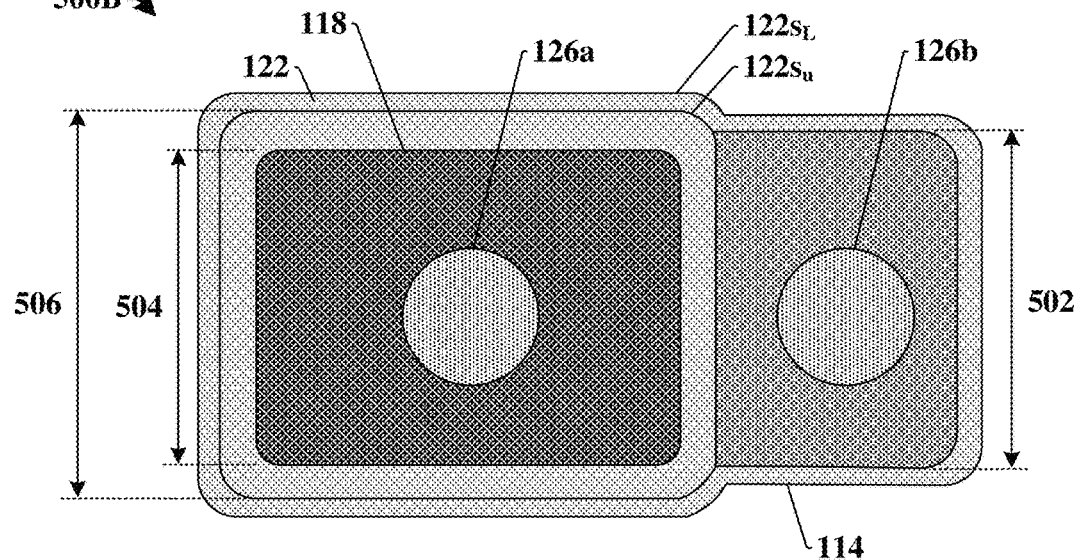

FIGS. 5A-5B illustrate some additional embodiments of an integrated chip having an RRAM device comprising bottom and top electrodes coupled to overlying interconnect vias.

As shown in cross-sectional view 500A of FIG. 5A, the integrated chip comprises an RRAM device 112 disposed over an etch stop material 110 over a substrate 102. The RRAM device 112 comprises a data storage structure 116 between a bottom electrode 114 and a top electrode 118. A sidewall spacer 122 is disposed along sidewalls of the bottom electrode 114, the data storage structure 116, the top electrode 118, and the hard mask 120. The sidewall spacer 120 has a first lower surface contacting the bottom electrode 114 and a second lower surface contacting the etch stop material 110. The sidewall spacer 122 further comprises a lower sidewall $122s_L$ and an upper sidewall $122su$ disposed over the lower sidewall $122s_L$. Along a first side of the RRAM device 112, the lower sidewall $122s_L$ and the upper sidewall $122su$ may intersect at a position vertically between a bottom and a top of the data storage structure 116. Along an opposing second side of the RRAM device 112, the lower sidewall $122s_L$ is laterally separated from the upper sidewall $122s_u$.

As shown in top view 500B of FIG. 5B, the upper sidewall $122s_u$ of the sidewall spacer 122 extends around the top electrode 118, while the lower sidewall $122s_L$ extends around the bottom electrode 114 and the top electrode 118. The lower sidewall $122s_L$ laterally extends outward past the upper sidewall $122s_u$ in opposing directions.

In some embodiments, the bottom electrode 114 and the top electrode 118 may have different widths measured along a first direction 314. For example, the bottom electrode 114 may have a first width 502 and the top electrode 118 may have second width 504 that is less than the first width 502.

In some embodiments, the first width 502 is greater than the second width 504 and less than a third width 506 measured along the first direction 314 between the upper sidewall 122$s_u$ of the sidewall spacer 122.

Figure 6A:
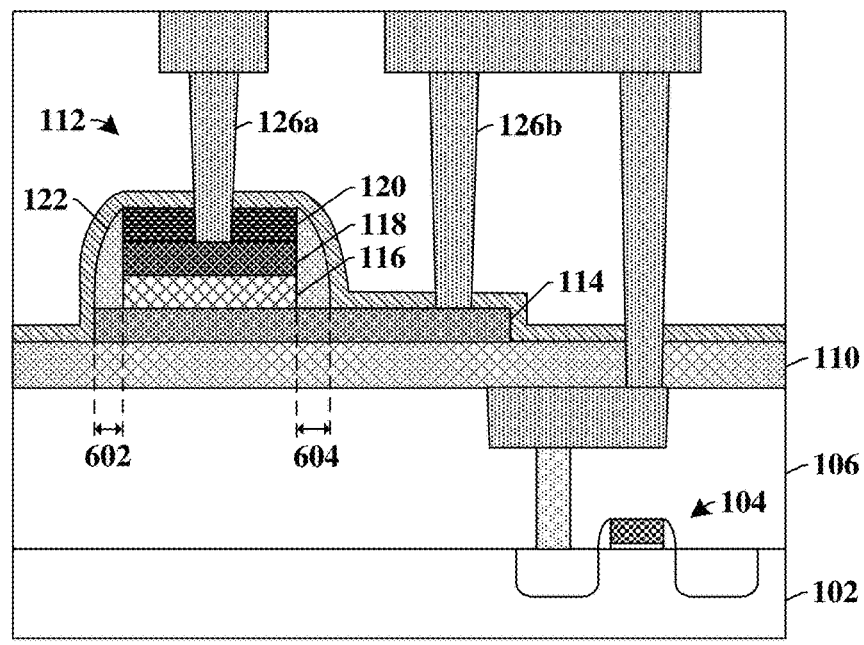
FIGS. 6A-6B illustrate some additional embodiments of an integrated chip having an RRAM device comprising bottom and top electrodes coupled to overlying interconnect vias.
Figure 6B:
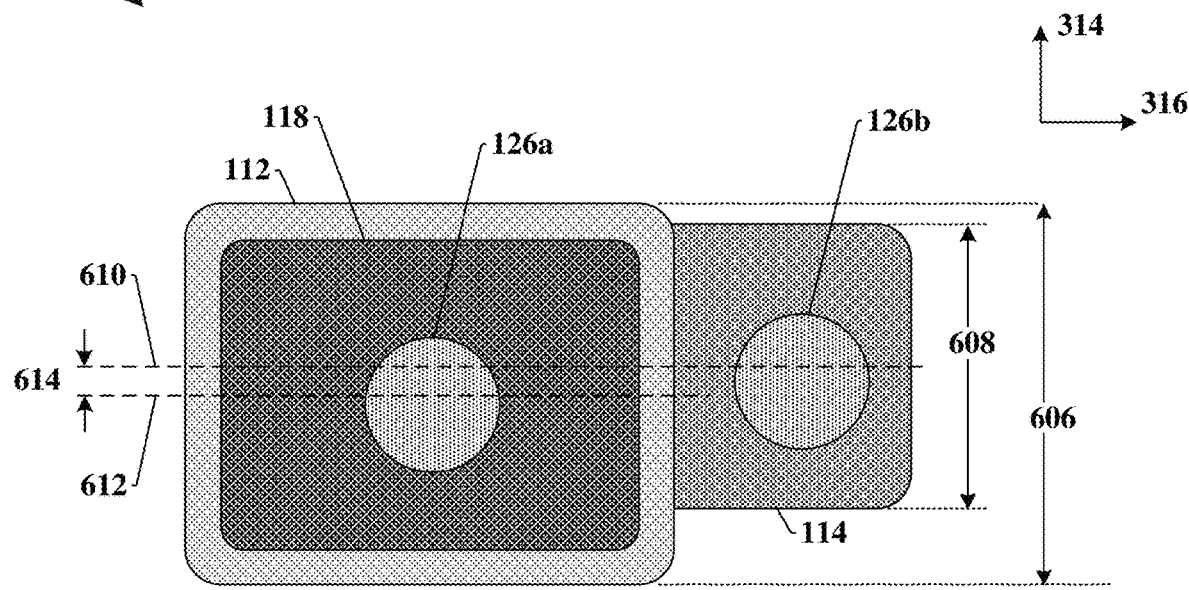

FIGS. 6A-6B illustrate some additional embodiments of an integrated chip having an RRAM device comprising bottom and top electrodes coupled to overlying interconnect vias.

As shown in cross-sectional view 600A of FIG. 6A, the integrated chip comprises an RRAM device 112 disposed over an etch stop material 110 over a substrate 102. The RRAM device 112 comprises a data storage structure 116 between a bottom electrode 114 and a top electrode 118. A sidewall spacer 122 is disposed along sidewalls of the data storage structure 116, the top electrode 118, and a hard mask 120.

Along a first side of the RRAM device 112, an outer sidewall of the sidewall spacer 122 is substantially aligned with an outermost sidewall of the bottom electrode 114. By aligning the outermost sidewall of the bottom electrode 114 with an outer sidewall of the sidewall spacer 122, a self-aligned patterning process can be used to pattern the outermost sidewall of the bottom electrode 114, thereby providing for a smaller distance between bottom electrodes of adjacent RRAM devices within an array. Along an opposing second side of the RRAM device 112, the bottom electrode 114 extends past an outer sidewall of the sidewall spacer 122. By having the bottom electrode 114 extend past the outer sidewall of the sidewall spacer 122, the bottom electrode 114 can be electrically contacted by a second upper interconnect via 126b, so as to reduce a height of the RRAM device 112.

In some embodiments, the sidewall spacer 122 may have a first width 602 along a first side of the RRAM device 112 and a second width 604 along a second side of the RRAM device 112. In some embodiments, the first width 602 may be substantially equal to the second width 604. In other embodiments, the first width 602 may be less than the second width 604.

As shown in top view 600B of FIG. 6B, the bottom electrode 114 may have different widths measured along a first direction 314 at different lateral positions along a second direction 316. For example, the bottom electrode 114 may have a first width 606 measured along the first direction 314 at a position that is directly below the top electrode 118 and sidewall spacer 122. The bottom electrode 114 may further have a second width 608 measured along the first direction 314 at a position that is laterally outside of the top electrode 118 and the sidewall spacer 122. In some embodiments, the first width 606 may be greater than the second width 608.

In some embodiments, the bottom electrode 114 may be centered along a first line 610 extending in the second direction 316 and the top electrode 118 may be centered along a second line 612 extending in the second direction 316. In some embodiments, the first line 610 is offset (i.e., separated) from the second line 612 along the first direction 314 by a non-zero distance 614. In other embodiments (not shown), the first line 610 and the second line 612 may be substantially aligned (e.g., not separated) along the first direction 314.

Figure 7A:
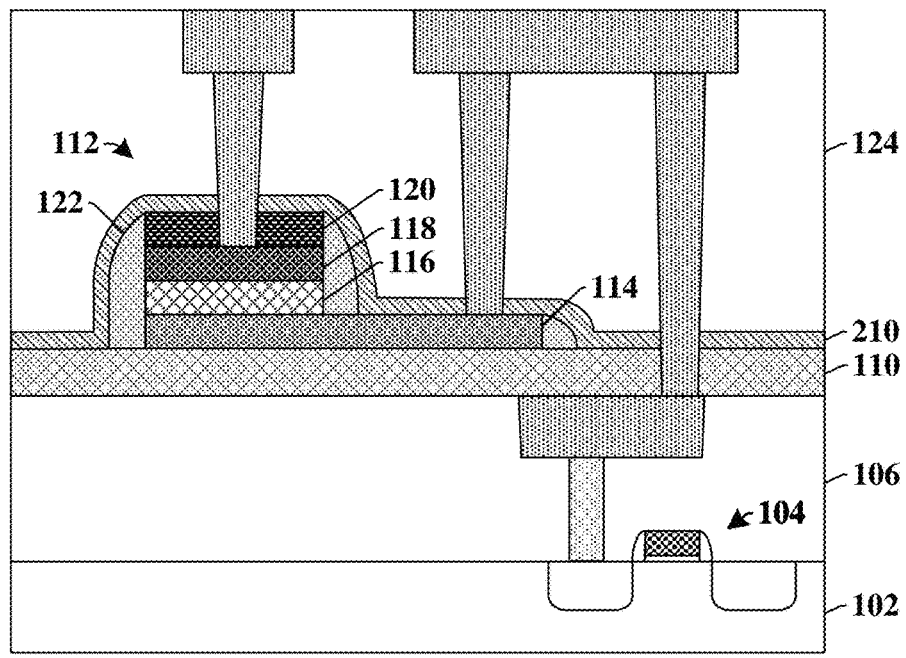
FIGS. 7A-7B illustrate some additional embodiments of an integrated chip having an RRAM device comprising bottom and top electrodes coupled to overlying interconnect vias.
Figure 7B:
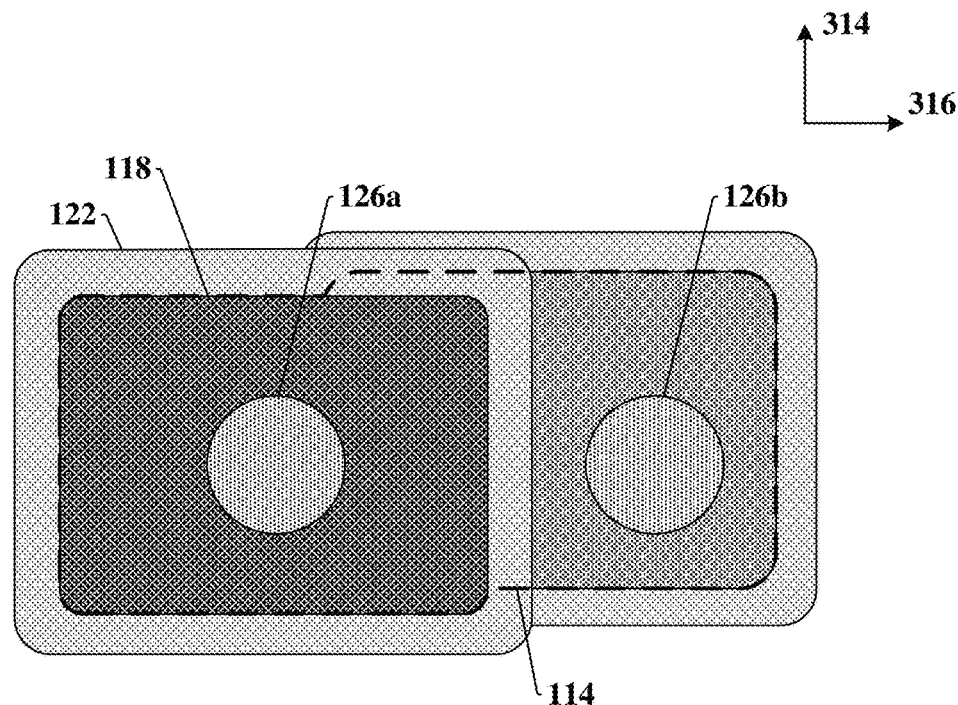

FIGS. 7A-7B illustrate some additional embodiments of an integrated chip having an RRAM device comprising bottom and top electrodes coupled to overlying interconnect vias.

As shown in cross-sectional view 700A of FIG. 7A, the integrated chip comprises an RRAM device 112 disposed over an etch stop material 110 over a substrate 102. The RRAM device 112 comprises a data storage structure 116 between a bottom electrode 114 and a top electrode 118. A sidewall spacer 122 is disposed along sidewalls of the data storage structure 116, the top electrode 118, and a hard mask 120. Along a first side of the RRAM device 112, the sidewall spacer 122 is disposed along an outermost sidewall of the bottom electrode 114, so that the sidewall spacer 122 vertically extends from a top of the hard mask 120 to a bottom of the bottom electrode 114. Along an opposing second side of the RRAM device 112, the bottom electrode 114 laterally extends past a sidewall of the sidewall spacer 122.

As shown in top view 700B of FIG. 7B, in some embodiments, the bottom electrode 114 (illustrated by a dashed line) may have sidewalls that change positions along a first direction 314 at different positions along a second direction 316. In some such embodiments, the bottom electrode 114 may have sidewalls extending in the second direction 316, which exhibit a jog when viewed from the top view.

Figure 8:
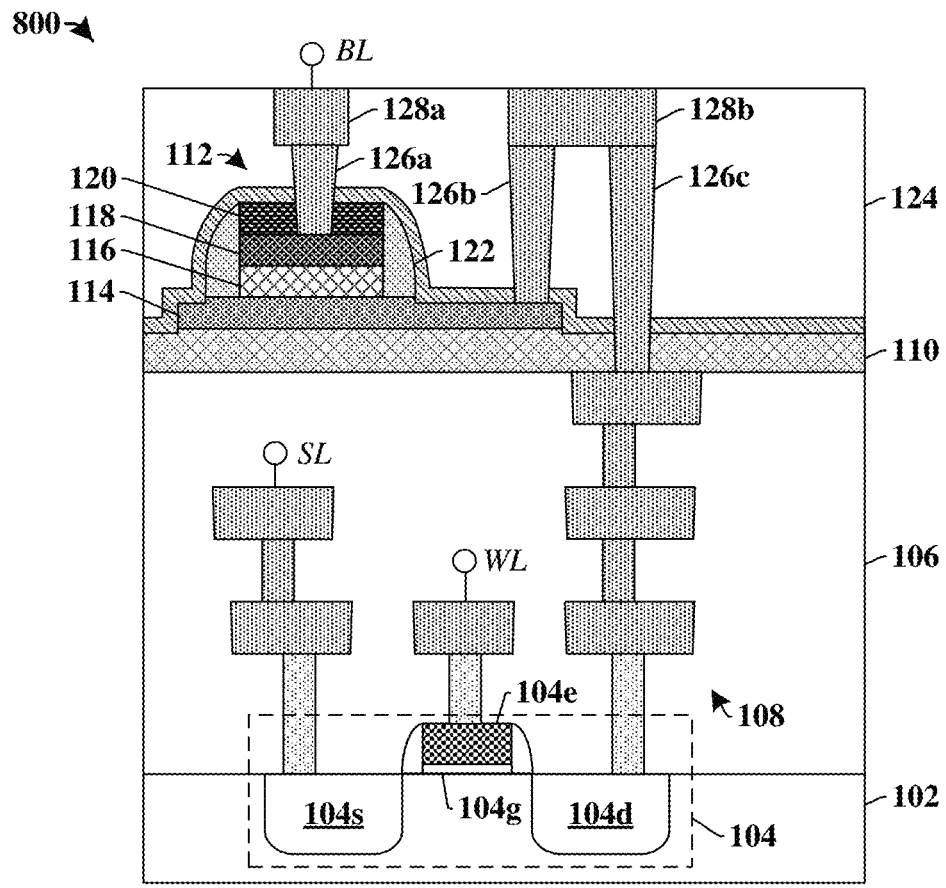
FIGS. 8-9 illustrate cross-sectional views of some additional embodiments of integrated chips having an RRAM device comprising bottom and top electrodes coupled to overlying interconnect vias.

FIG. 8 illustrates a cross-sectional view of some additional embodiments of an integrated chip 800 having an RRAM device comprising bottom and top electrodes coupled to overlying interconnect vias.

The integrated chip 800 comprises an access device 104 disposed within a substrate 102. A plurality of lower interconnect layers 108 are disposed within a lower ILD structure 106 that is over the substrate 102 and surrounding the access device 104. In some embodiments, the access device 104 comprises a gate electrode 104e vertically separated from the substrate 102 by a gate dielectric 104g and laterally between a source region 104s and a drain region 104d. The gate electrode 104e may be coupled to a word-line WL while the source region 104s may be coupled to a source-line SL.

An RRAM device 112 is disposed over an etch stop material 110 on the lower ILD structure 106. The RRAM device 112 comprises a data storage structure 116 between a bottom electrode 114 and a top electrode 118. A first upper interconnect via 126a is disposed on the top electrode 118. The first upper interconnect via 126a couples the top electrode to a bit-line BL by way of a first interconnect wire 128a. A second upper interconnect via 126b is disposed on an upper surface of the bottom electrode 114. The second upper interconnect via 126b is coupled to a second interconnect wire 128b. A third upper interconnect via 126c couples the second interconnect wire 128b to the drain region 104d of the access device 104 by way of the plurality of lower interconnect layers 108.

In some embodiments, the second interconnect wire 128b may have a first outer sidewall and a second outer sidewall facing opposite directions. Typically, the interconnect wires and/or interconnect vias are separated by a minimum distance defined by design ground rules. To reduce a size of an RRAM cell comprising the RRAM device 112, the first outer sidewall of the second interconnect wire 128b may be aligned with an outer sidewall of the second upper interconnect via 126b and the second outer sidewall of the second interconnect wire 128b may be aligned with an outer sidewall of the third upper interconnect via 126c.

Figure 9:
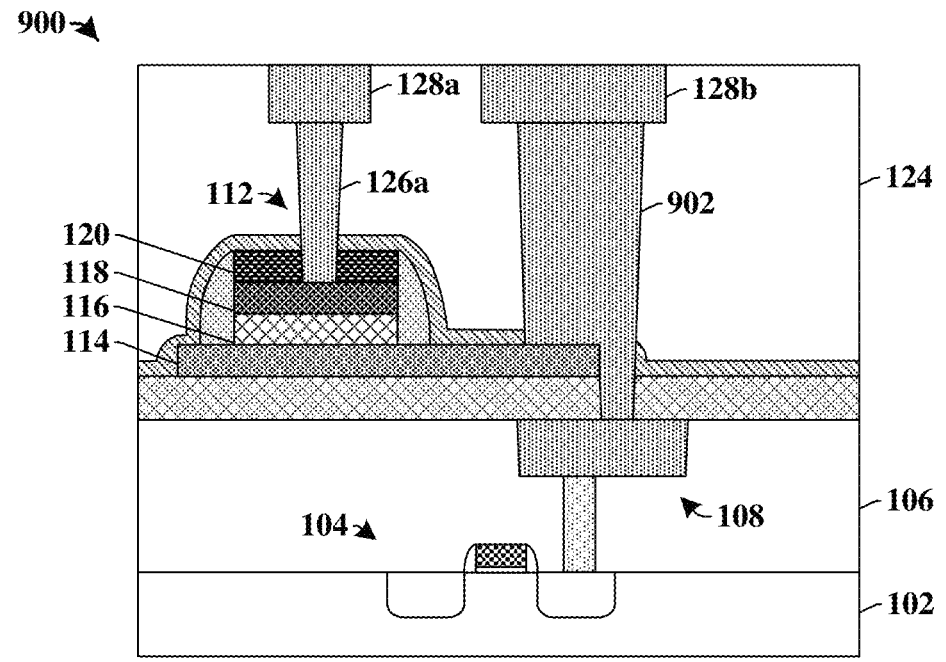

FIG. 9 illustrates a cross-sectional view of some additional embodiments of an integrated chip 900 having an RRAM device comprising bottom and top electrodes coupled to overlying interconnect vias.

The integrated chip 900 comprises an RRAM device 112 disposed over a lower ILD structure 106 surrounding a plurality of lower interconnect layers 108. The RRAM device 112 comprises a data storage structure 116 between a bottom electrode 114 and a top electrode 118. A first upper interconnect via 126a is disposed on the top electrode 118. A second upper interconnect via 902 is disposed on an upper surface of the bottom electrode 114. In some embodiments, the first upper interconnect via 126a may have a smaller width than the second upper interconnect via 902. In some embodiments, the second upper interconnect via 902 may extend from directly over the bottom electrode 114 to a position laterally outside of the bottom electrode 114. In such embodiments, the second upper interconnect via 902 may continuously extend to one of the plurality of lower interconnect layers 108. By having the second upper interconnect via 902 contact both the bottom electrode 114 and the one of the plurality of lower interconnect layers 108, an area of an RRAM cell comprising the RRAM device 112 may be decreased.

FIGS. 10-21 illustrate cross-sectional views 1000-2100 of some embodiments of a method of forming an integrated chip having an RRAM device comprising bottom and top electrodes coupled to overlying interconnect vias. Although FIGS. 10-21 are described in relation to a method, it will be appreciated that the structures disclosed in FIGS. 10-21 are not limited to such a method, but instead may stand alone as structures independent of the method.

Figure 10:
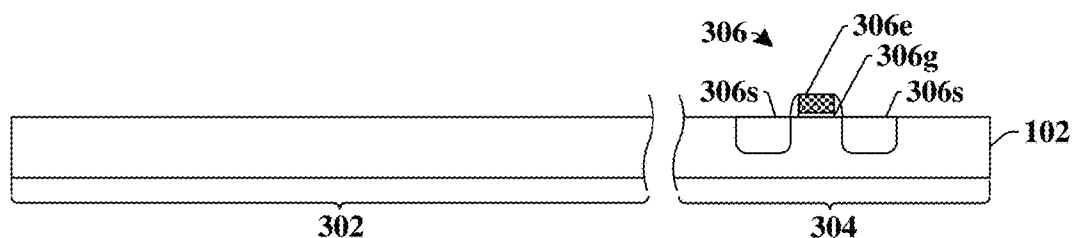
FIGS. 10-21 illustrate cross-sectional views of some embodiments of a method of forming an integrated chip having an RRAM device comprising bottom and top electrodes coupled to overlying interconnect vias.

As shown in cross-sectional view 1000 of FIG. 10, a substrate 102 is provided. The substrate 102 comprises an embedded memory region 302 and a logic region 304. A logic device 306 is formed within the logic region 304 of the substrate 102. In various embodiments, the substrate 102 may be any type of semiconductor body (e.g., silicon, SiGe, SOI, etc.), such as a semiconductor wafer and/or one or more die on a wafer, as well as any other type of semiconductor and/or epitaxial layers, associated therewith. In some embodiments, the logic device 306 may comprise a transistor. In some such embodiments, the logic device 306 may be formed by depositing a gate dielectric film and a gate electrode film over the substrate 102. The gate dielectric film and the gate electrode film are subsequently patterned to form a gate dielectric (e.g., 306g) and a gate electrode (e.g., 306e). The substrate 102 may be subsequently implanted to form a source region (e.g., 306s) and a drain region (e.g., 306d) within the substrate 102 on opposing sides of the gate electrode (e.g., 306c).

Figure 11:
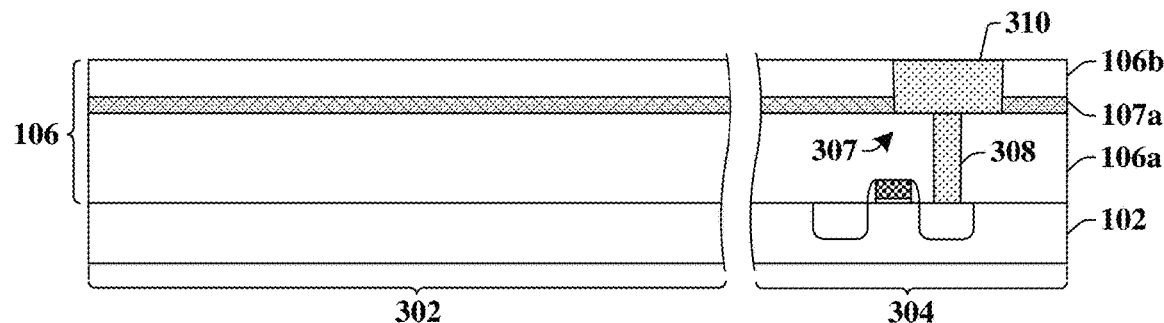

As shown in cross-sectional view 1100 of FIG. 11, one or more additional interconnect layers 307 are formed within a lower ILD structure 106 comprising one or more lower ILD layers 106a-106b over the substrate 102. In some embodiments, the one or more lower ILD layers 106a-106b may comprise a first lower ILD layer 106a and a second lower ILD layer 106b separated by a first etch stop layer 107a. In some embodiments, the one or more additional interconnect layers 307 may comprise a conductive contact 308 and an interconnect wire 310. In some additional embodiments (not shown), the one or more additional interconnect layers 307 may further comprise an interconnect via. The one or more additional interconnect layers 307 may be formed by forming one of the one or more lower ILD layers 106a-106b (e.g., an oxide, a low-k dielectric, or an ultra low-k dielectric) over the substrate 102, selectively etching the lower ILD layer to define a via hole and/or a trench within the lower ILD layer, forming a conductive material (e.g., copper, aluminum, etc.) within the via hole and/or a trench, and performing a planarization process (e.g., a chemical mechanical planarization process).

Figure 12:
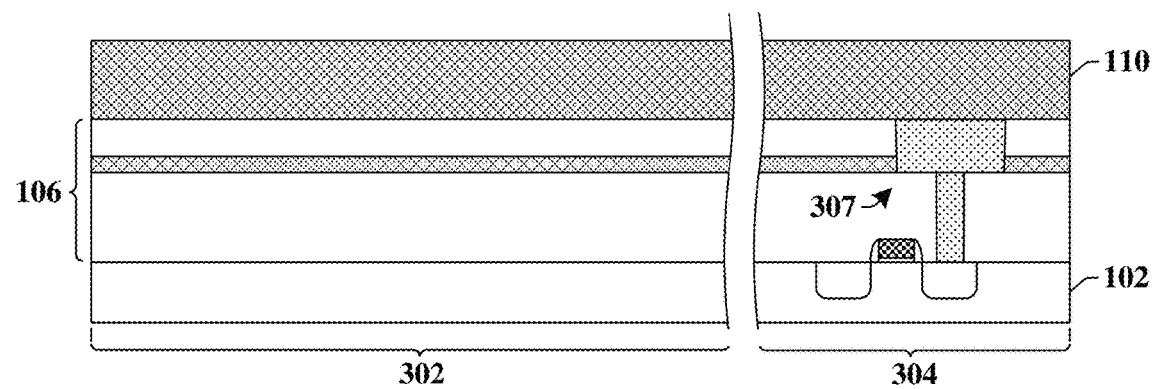

As shown in cross-sectional view 1200 of FIG. 12, an etch stop material 110 is formed over the lower ILD structure 106. In some embodiments, the etch stop material 110 may comprise one or more of an oxide, silicon nitride, silicon carbide, silicon oxynitride, TEOS, or the like. In some embodiments, the etch stop material 110 may be formed by a deposition process (e.g., physical vapor deposition (PVD), chemical vapor deposition (CVD), PE-CVD, atomic layer deposition (ALD), sputtering, etc.). In some embodiments, the etch stop material 110 may be formed to a thickness in a range of between approximately 100 angstroms and approximately 200 angstroms. In other embodiments, the etch stop material 110 may be formed to a thickness in a range of between approximately 125 angstroms and approximately 175 angstroms. In yet other embodiments, the etch stop material 110 may be formed to a thickness of approximately 150 angstroms. The thickness of the etch stop material 110 allows for an overlying RRAM device (e.g., 112a-112b of FIG. 18) to remain relatively small (e.g., less than approximately 800 angstroms).

Figure 13:
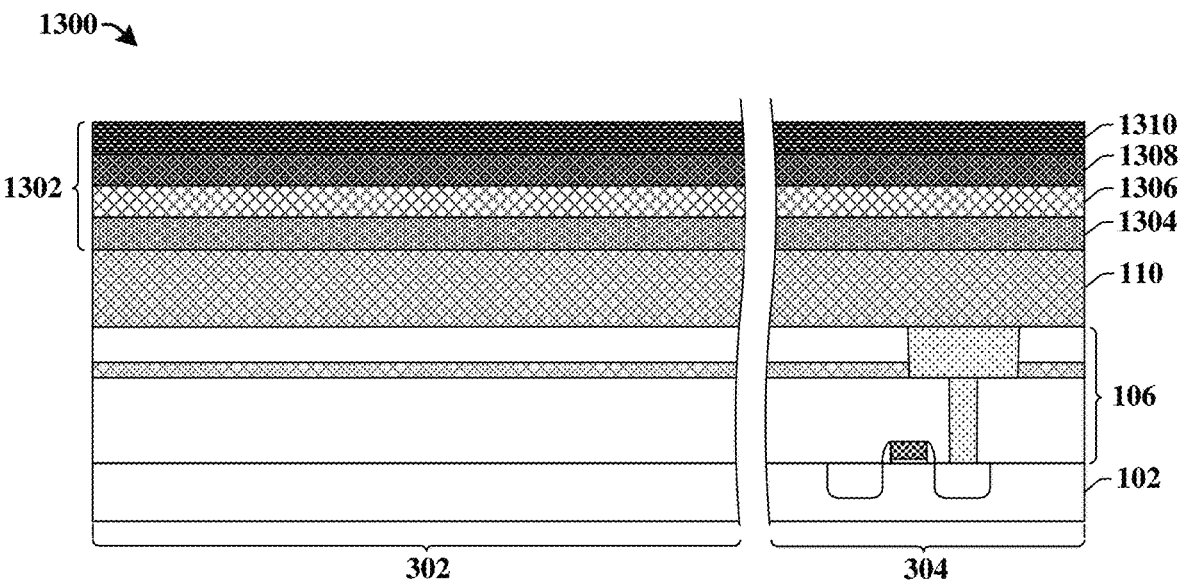

As shown in cross-sectional view 1300 of FIG. 13, an RRAM device stack 1302 is formed over the etch stop material 110. The RRAM device stack 1302 comprises a bottom electrode layer 1304, a data storage layer 1306 formed over the bottom electrode layer 1304, a top electrode layer 1308 formed over the data storage layer 1306, and a hard mask layer 1310 formed over the top electrode layer 1308. In some embodiments, the bottom electrode layer 1304, the data storage layer 1306, the top electrode layer 1308, and the hard mask layer 1310 may be formed by way of a plurality of different deposition processes (e.g., CVD, PE-CVD, sputtering, ALD, or the like).

Figure 14:
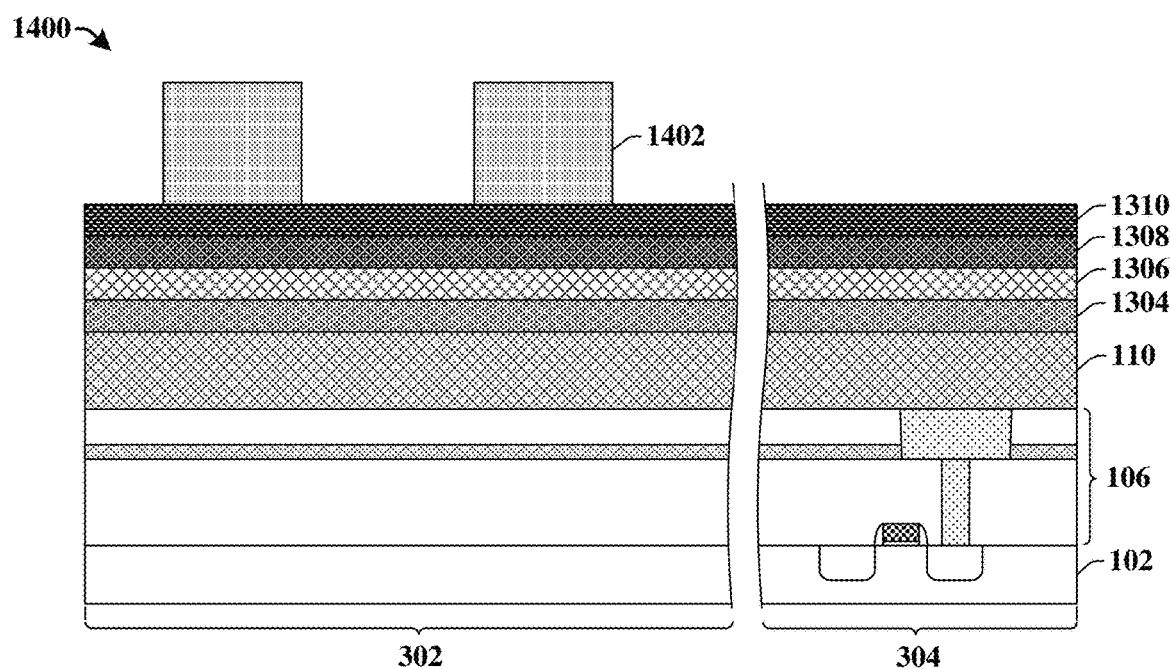

As shown in cross-sectional view 1400 of FIG. 14, a first masking layer 1402 is formed over the hard mask layer 1310. In some embodiments, the first masking layer 1402 may comprise a photosensitive material. In some such embodiments, the photosensitive material may be spun on and then selectively exposed to electromagnetic radiation according to a photomask. The electromagnetic radiation modifies a solubility of exposed regions within the photosensitive material to define soluble regions. The photosensitive material is subsequently developed to define the first masking layer 1402 by removing the soluble regions.

Figure 15:
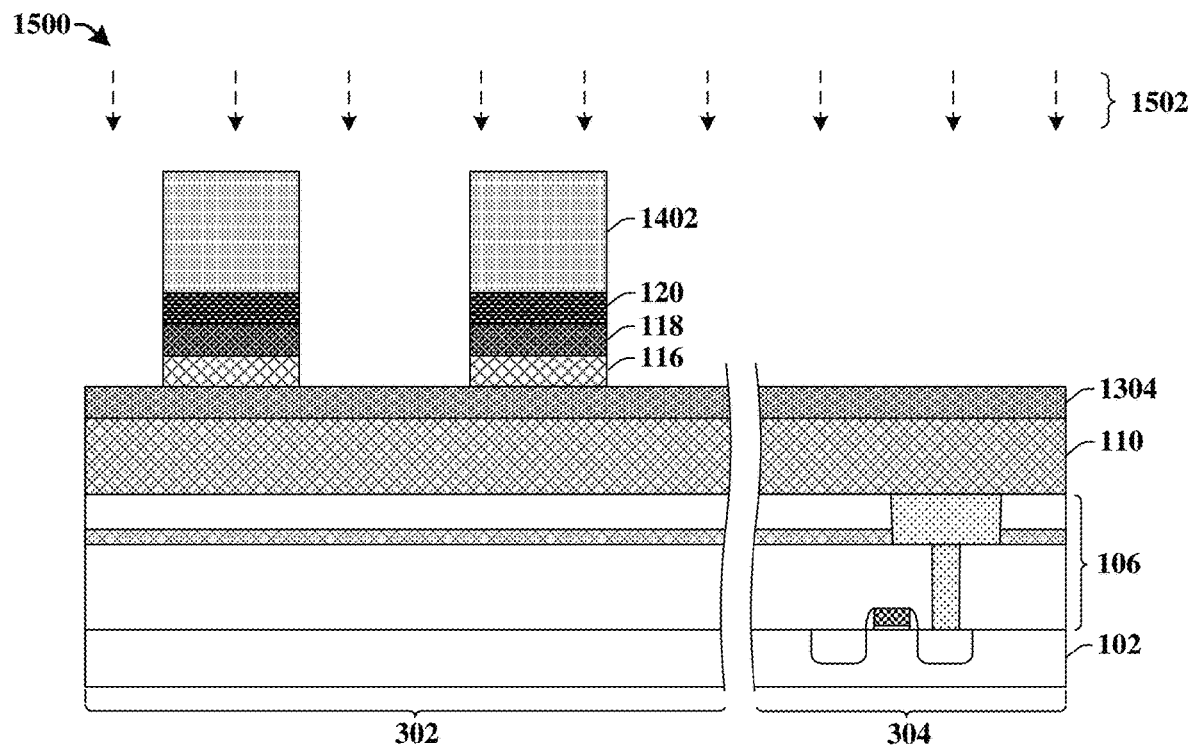

As shown in cross-sectional view 1500 of FIG. 15, a first patterning process is performed to define a data storage structure 116, a top electrode 118, and a hard mask 120. The first patterning process selectively exposes the hard mask layer (1310 of FIG. 14), the top electrode layer (1308 of FIG. 14), and the data storage layer (1306 of FIG. 14) to a first etchant 1502 according to the first masking layer 1402 to define the data storage structure 116, the top electrode 118, and the hard mask 120.

Figure 16:
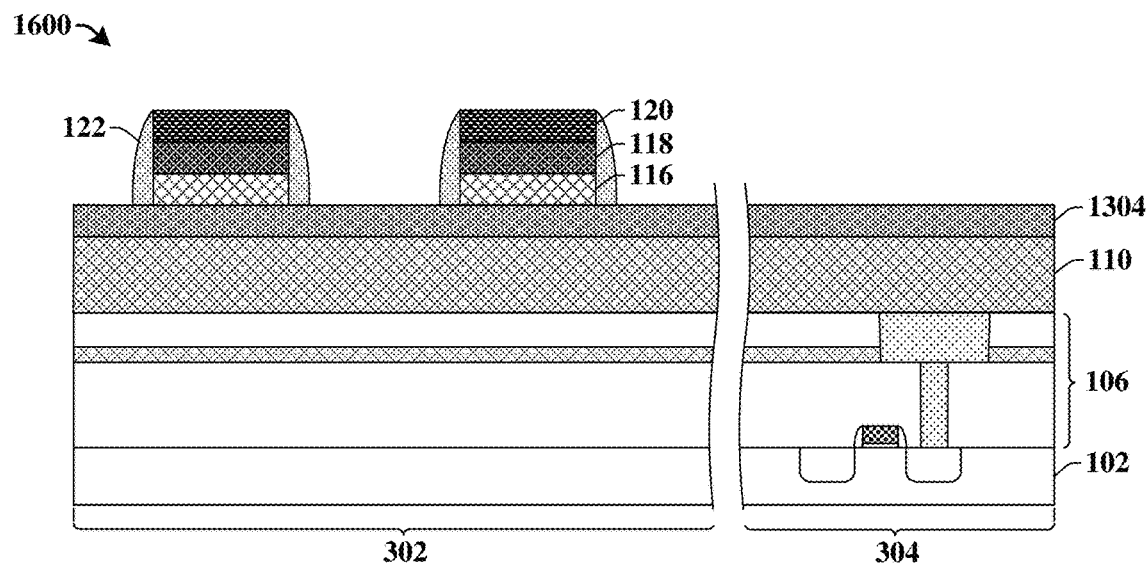

As shown in cross-sectional view 1600 of FIG. 16, sidewall spacers 122 are formed along sidewalls of the data storage structure 116, the top electrode 118, and the hard mask 120. In various embodiments, the sidewall spacers 122 may comprise silicon nitride, silicon dioxide, silicon oxynitride, or the like. In some embodiments, the sidewall spacers 122 may be formed by forming a spacer layer over the substrate. The spacer layer is subsequently exposed to an etchant (e.g., a dry etchant), which removes the spacer layer from horizontal surfaces. Removing the spacer layer from horizontal surfaces leaves a part of the spacer layer along opposing sides of the data storage structure 116, the top electrode 118, and the hard mask 120 as the sidewall spacers 122.

Figure 17:
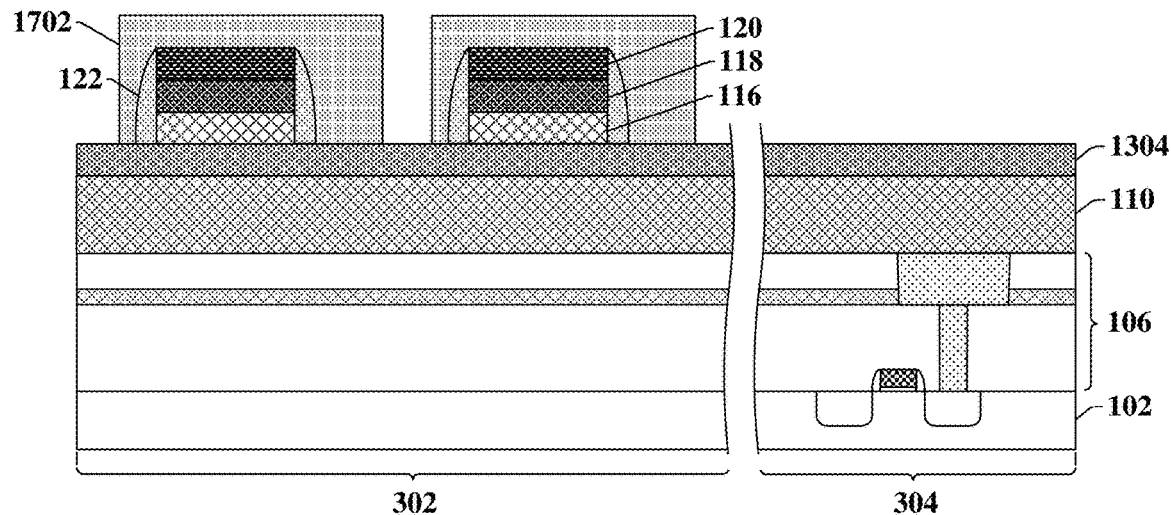

As shown in cross-sectional view 1700 of FIG. 17, a second masking layer 1702 is formed. In some embodiments, the second masking layer 1702 may comprise a photosensitive material (e.g., photoresist).

Figure 18:
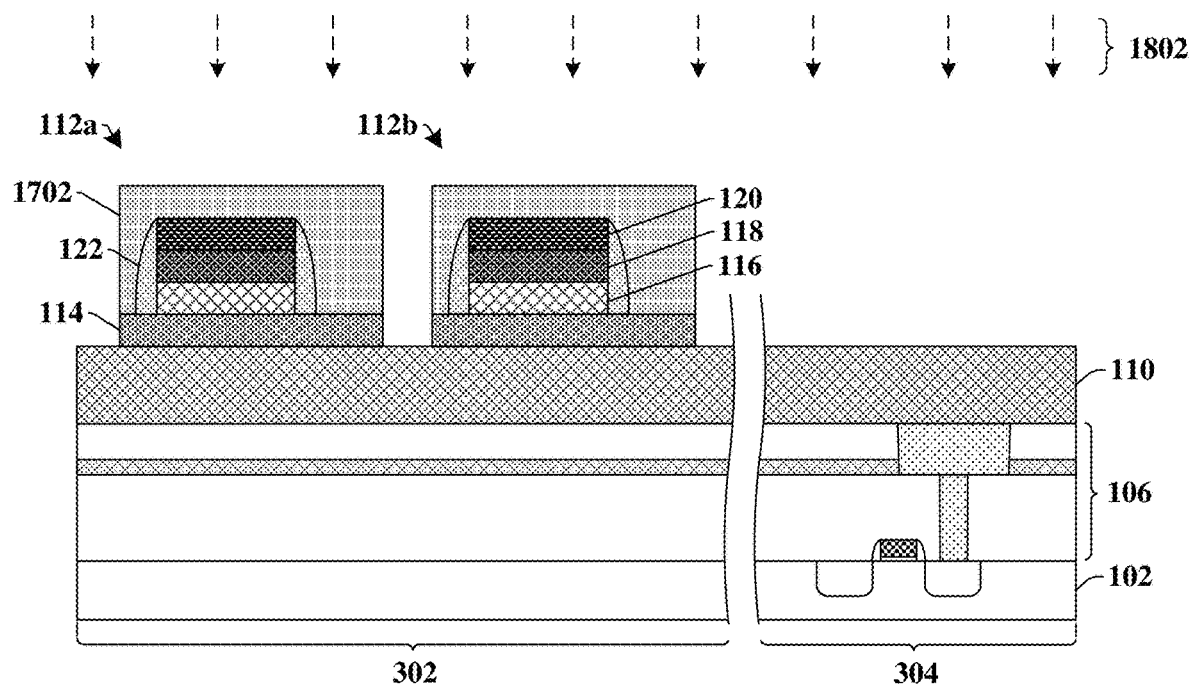

As shown in cross-sectional view 1800 of FIG. 18, a second patterning process is performed according to the second masking layer 1702 to define a first RRAM device 112a and a second RRAM device 112b. The second patterning process selectively exposes the bottom electrode layer (1304 of FIG. 17) to a second etchant 1802 to define the bottom electrode 114.

Figure 19:
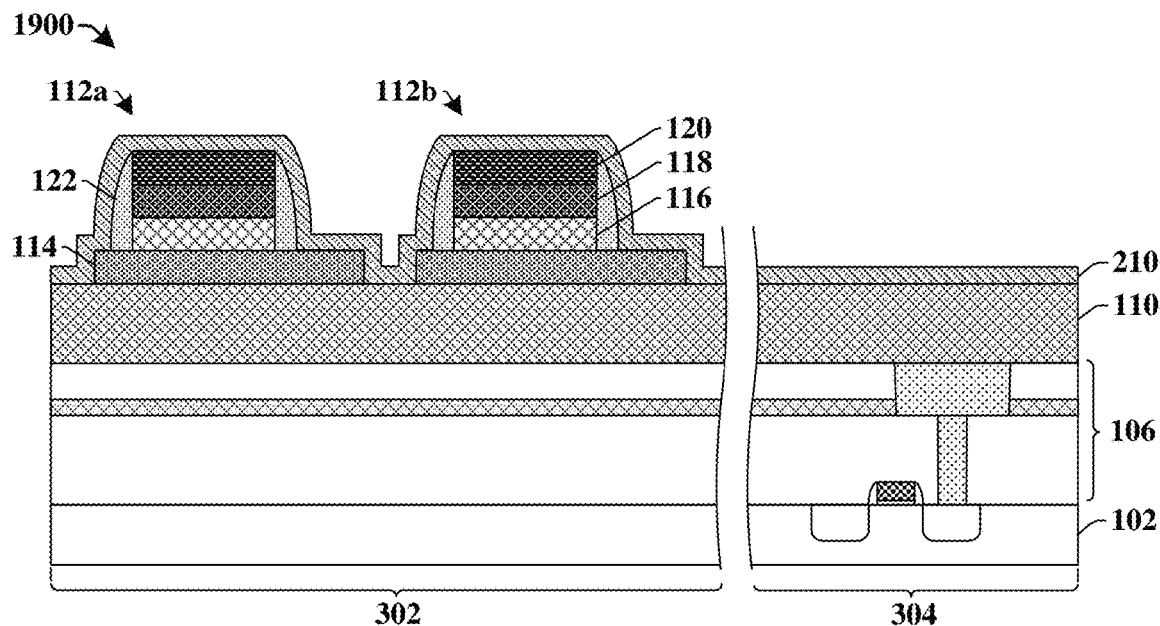

As shown in cross-sectional view 1900 of FIG. 19, a protective layer 210 is formed over the first RRAM device 112a and the second RRAM device 112b. In some embodiments, the protective layer 210 may be formed using a deposition technique (e.g., PVD, CVD, PE-CVD, ALD, sputtering, etc.). In various embodiments, the protective layer 210 may comprise one or more of silicon carbide, TEOS, or the like.

Figure 20:
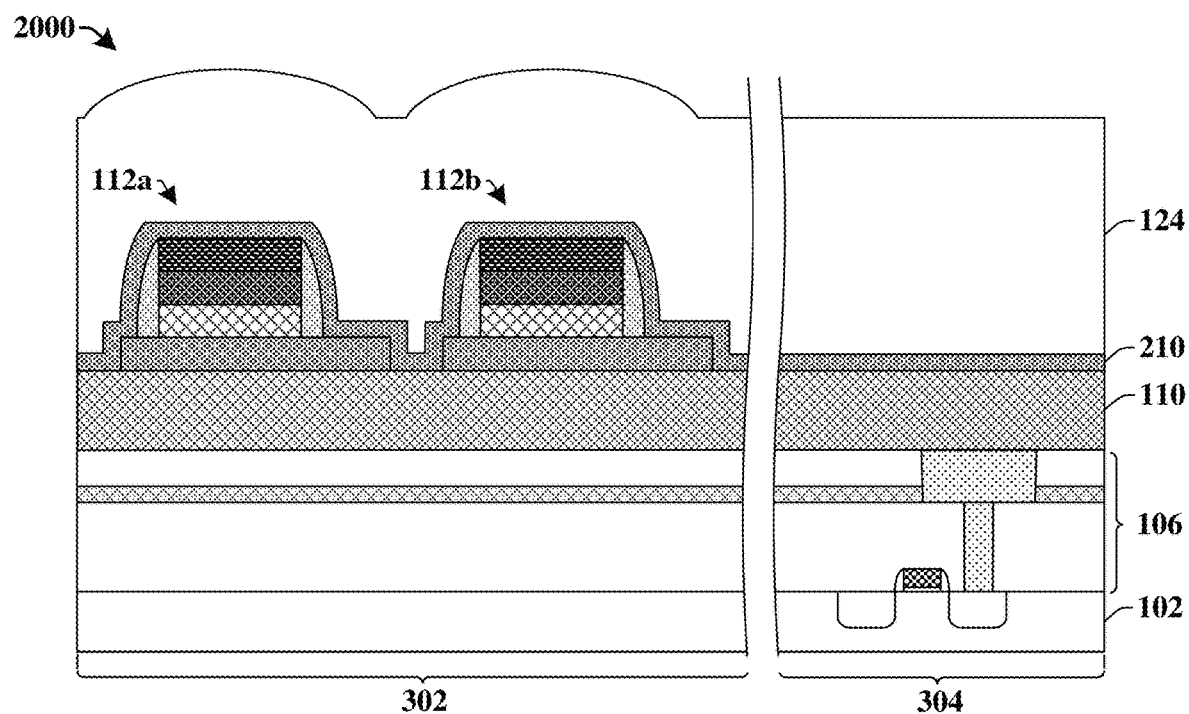

As shown in cross-sectional view 2000 of FIG. 20, an upper ILD structure 124 is formed over the protective layer 210. The upper ILD structure 124 is formed to cover the first RRAM device 112a and the second RRAM device 112b. In some embodiments, the upper ILD structure 124 may be formed by a deposition process (e.g., PVD, CVD, PE-CVD, ALD, or the like). In various embodiments, the upper ILD structure 124 may comprise silicon dioxide, carbon doped silicon dioxide, silicon oxynitride, BSG, PSG, BPSG, FSG, a porous dielectric material, or the like.

Figure 21:
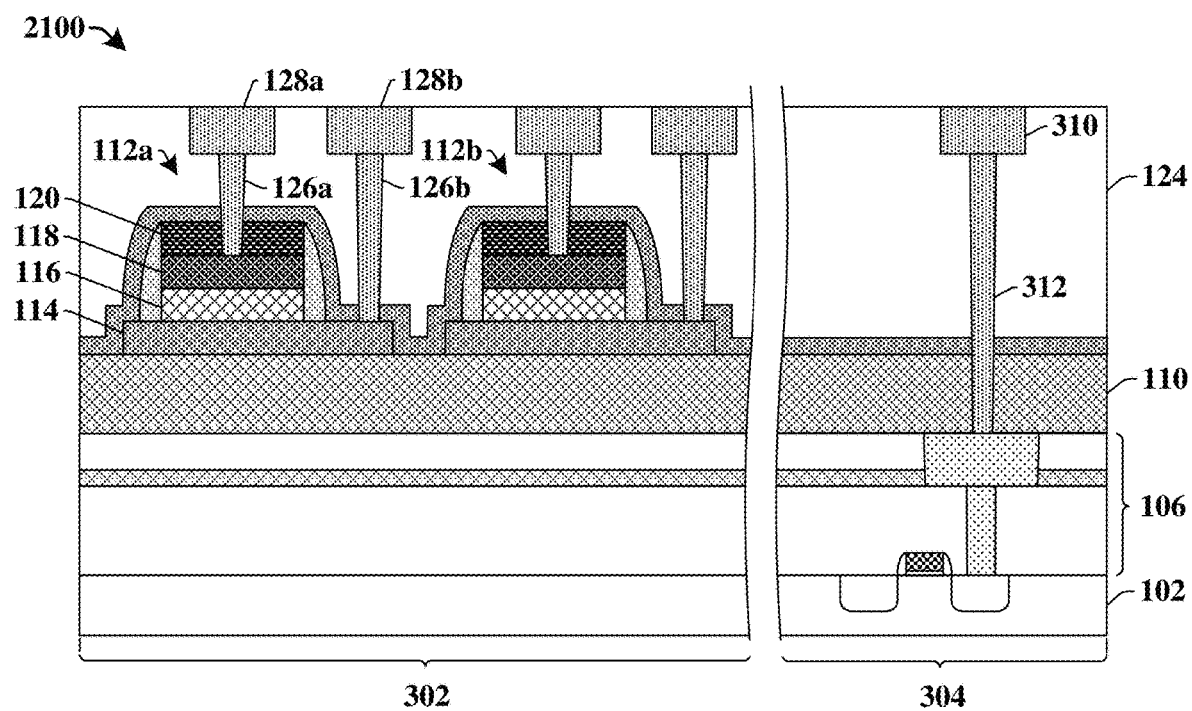

As shown in cross-sectional view 2100 of FIG. 21, upper interconnect vias 126a-126c and upper interconnect wires 128a-128b are formed within upper ILD structure 124 in the embedded memory region 302. The upper interconnect vias 126a-126c comprise a first upper interconnect via 126a that contacts an upper surface of the top electrode 118 and a second upper interconnect via 126b that contacts an upper surface of the bottom electrode 114.

One or more additional interconnect layers 310-312 are also formed in the upper ILD structure 124 within the logic region 304. In some embodiments, the upper interconnect vias 126a-126c and upper interconnect wires 128a-128b may be concurrently formed with the one or more additional interconnect layers 310-312 by selectively etching the upper ILD structure 124 to define via holes and/or trenches within the upper ILD structure 124, forming a conductive material (e.g., copper, aluminum, etc.) within the via holes and/or trenches, and performing a planarization process (e.g., a chemical mechanical planarization process). In some embodiments, the planarization process may comprise a chemical mechanical planarization (CMP) process.

Figure 22:
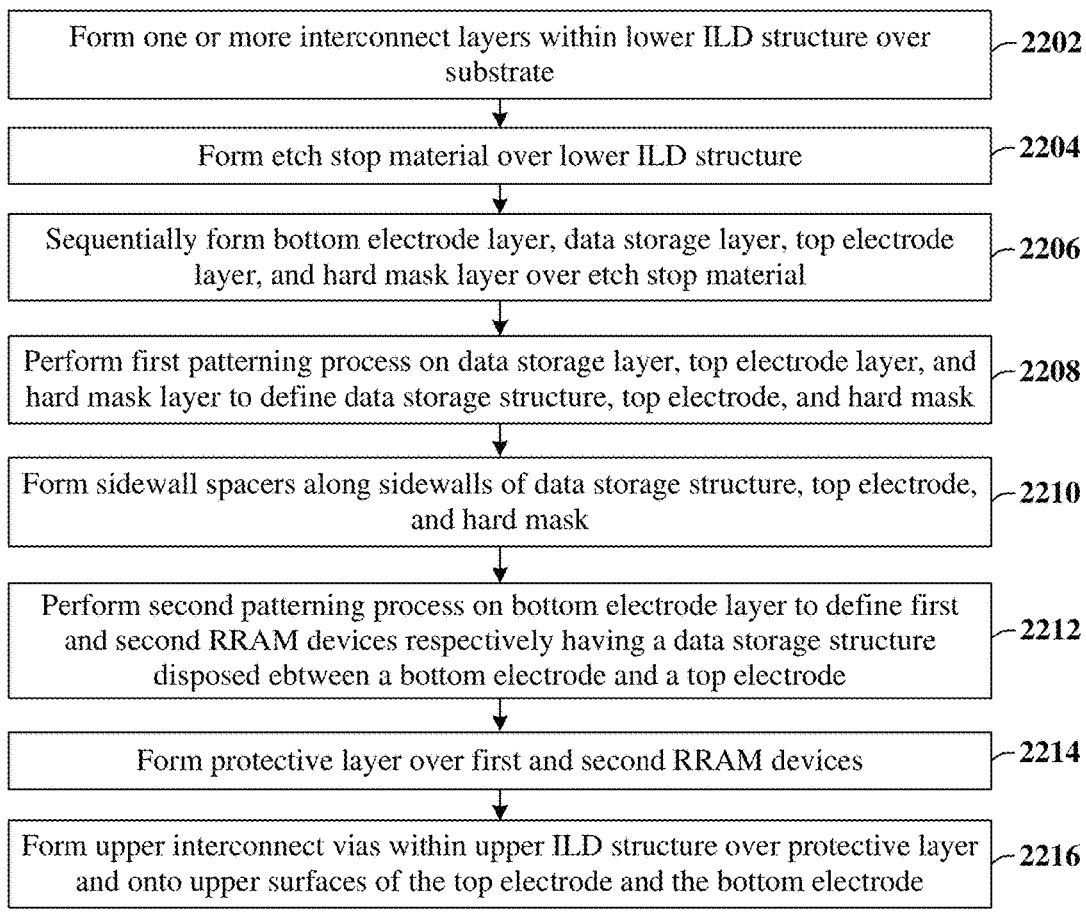
FIG. 22 illustrates a flow diagram of some embodiments of a method of forming an integrated chip having an RRAM device comprising bottom and top electrodes coupled to overlying interconnect vias.

FIG. 22 illustrates a flow diagram of some embodiments of a method 2200 of forming an integrated chip having an RRAM device comprising bottom and top electrodes coupled to an overlying interconnect vias.

While method 2200 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 2202, one or more interconnect layers are formed within a lower inter-level dielectric (ILD) structure over a substrate. FIG. 11 illustrates a cross-sectional view 1100 of some embodiments corresponding to act 2202.

At 2204, an etch stop material is formed over the lower ILD structure. FIG. 12 illustrates a cross-sectional view 1200 of some embodiments corresponding to act 2204.

At 2206, a bottom electrode layer, a data storage layer, a top electrode layer, and a hard mask layer are sequentially formed over the etch stop material. FIG. 13 illustrates a cross-sectional view 1300 of some embodiments corresponding to act 2206.

At 2208, a first patterning process is performed on the data storage layer, the top electrode layer, and the hard mask layer to define a data storage structure, a top electrode, and a hard mask. FIGS. 14-15 illustrate cross-sectional views 1400-1500 of some embodiments corresponding to act 2208.

At 2210, sidewall spacers are formed along sidewalls of the data storage structure, the top electrode, and the hard mask. In some alternative embodiments, the sidewall spacers may be formed after act 2212. FIG. 16 illustrates a cross-sectional view 1600 of some embodiments corresponding to act 2210.

At 2212, a second patterning process is performed on the bottom electrode layer to define a first RRAM device and a second RRAM device, respectively having a data storage structure disposed between a bottom electrode and the top electrode. FIGS. 17-18 illustrate cross-sectional views 1700-1800 of some embodiments corresponding to act 2212.

At 2214, a protective layer is formed over the first RRAM device and the second RRAM device. FIG. 19 illustrates a cross-sectional view 1900 of some embodiments corresponding to act 2214.

At 2216, upper interconnect vias are formed within an upper ILD structure over the protective layer and onto upper surfaces of the top electrode and the bottom electrode. FIGS. 20-21 illustrate cross-sectional views 2000-2100 of some alternative embodiments corresponding to act 2216.

Although the present disclosure is described in relation to an RRAM device, it will be appreciated that the present disclosure is not limited to RRAM devices but instead may be also applied to other types of memory devices (e.g., FeRAM, MRAM, or the like).

Accordingly, in some embodiments, the present disclosure relates to an integrated chip having a RRAM device comprising bottom and top electrodes coupled to overlying interconnect vias.

In some embodiments, the present disclosure relates to an integrated chip. The integrated chip includes a lower inter-level dielectric (ILD) structure surrounding a plurality of lower interconnect layers over a substrate; an etch stop material disposed over the lower ILD structure; a bottom electrode arranged over an upper surface of the etch stop material; a data storage structure disposed on an upper surface of the bottom electrode and configured to store a data state; a top electrode disposed on the data storage structure; a first interconnect via contacting the upper surface the bottom electrode; and a second interconnect via contacting the top electrode. In some embodiments, the upper surface of the etch stop material continuously extends between outermost sidewalls of the bottom electrode. In some embodiments, the integrated chip further includes one or more sidewall spacers disposed over the bottom electrode and along opposing sidewalls of the data storage structure and the top electrode. In some embodiments, the bottom electrode has a first thickness directly below the data storage structure and a second thickness directly below the one or more sidewall spacers, the second thickness less than the first thickness. In some embodiments, the bottom electrode extends past opposing outermost sidewalls of the one or more sidewall spacers. In some embodiments, the upper surface of the bottom electrode extends past opposing outermost sidewalls of the data storage structure; and the one or more sidewall spacers cover sidewalls of the bottom electrode. In some embodiments, the one or more sidewall spacers continuously extend from a sidewall of the top electrode to a sidewall of the bottom electrode. In some embodiments, the integrated chip further includes a sidewall spacer covering outermost sidewalls of the top electrode and the bottom electrode, the sidewall spacer having a first lower surface contacting the bottom electrode and a second lower surface contacting the etch stop material. In some embodiments, the integrated chip further includes a hard mask disposed over the top electrode; a sidewall spacer disposed along outermost sidewalls of the top electrode and the hard mask; and a protective layer contacting the hard mask, the sidewall spacer, the upper surface of the bottom electrode, and the etch stop material. In some embodiments, the integrated chip further includes a first interconnect wire contacting a top of the second interconnect via; and a third interconnect via contacting a bottom of the first interconnect wire and extending through the etch stop material to the plurality of lower interconnect layers, the plurality of lower interconnect layers couples the third interconnect via to a transistor device disposed within the substrate and directly below the bottom electrode. In some embodiments, the integrated chip further includes a first sidewall spacer disposed along sidewalls of the top electrode; and a second sidewall spacer disposed along sidewalls of the bottom electrode, the first sidewall spacer laterally separated from the second sidewall spacer.

In other embodiments, the present disclosure relates to an integrated chip. The integrated chip includes a bottom electrode arranged over an etch stop material over a substrate; a data storage structure disposed on an upper surface of the bottom electrode and configured to store a data state; a top electrode disposed on an upper surface of the data storage structure; a first interconnect via contacting the upper surface of the bottom electrode; a second interconnect via contacting an upper surface of the top electrode; and a sidewall spacer disposed over the bottom electrode and along opposing sidewalls of the data storage structure and the top electrode, the bottom electrode extending past opposing outermost sides of the sidewalls spacer. In some embodiments, the integrated chip further includes an interconnect wire contacting a top of the first interconnect via; and a third interconnect via contacting a bottom of the interconnect wire and extending through the etch stop material to a plurality of lower interconnect layers coupled to an access device. In some embodiments, a material of the etch stop material extends to a position that is vertically between a bottom and a top of the bottom electrode. In some embodiments, the bottom electrode extends past the top electrode along a first direction and along a second direction that is perpendicular to the first direction. In some embodiments, the integrated chip further includes a hard mask disposed over the top electrode; and a protective layer disposed over the hard mask, the protective layer contacting the bottom electrode on opposing sides of the data storage structure. In some embodiments, the first interconnect via has a lower surface that contacts the bottom electrode and that has a first width; and the second interconnect via has a second lower surface that contacts the top electrode and that has a second width, the second width different than the first width. In some embodiments, the etch stop material has a thickness that is in a range of between approximately 100 angstroms and approximately 200 angstroms.

In yet other embodiments, the present disclosure relates to a method of forming an integrated chip. The method includes forming an etch stop material over a lower inter-level dielectric (ILD) structure on a substrate; sequentially depositing a bottom electrode layer, a data storage layer, and a top electrode layer, over the etch stop material; performing a first patterning process on the top electrode layer and the data storage layer according to a first masking layer to define a top electrode and a data storage structure; forming sidewall spacers along opposing sides of the top electrode and the data storage structure; performing a second patterning process on the bottom electrode layer according to a second masking layer to define a bottom electrode; forming an upper ILD structure over the etch stop material; and forming a first interconnect via and a second interconnect via within the upper ILD structure, the first interconnect via contacting an upper surface of the bottom electrode and the second interconnect via contacts an upper surface of the top electrode. In some embodiments, the second masking layer is formed over the sidewall spacers and the bottom electrode layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated chip, comprising:
   a memory device arranged over an etch stop material over a substrate, wherein the memory device comprises a data storage structure disposed between a bottom electrode and a top electrode, and wherein the bottom electrode laterally extends to different distances past a first outermost sidewall and an opposing second outermost sidewall of the top electrode along a first direction and is off-centered from the top electrode along a second direction perpendicular to the first direction in a plan-view of the memory device;
   a first interconnect via contacting an upper surface of the bottom electrode;
   a second interconnect via contacting an upper surface of the top electrode;
   an interconnect wire contacting a top of the first interconnect via; and
   a third interconnect via contacting a bottom of the interconnect wire and extending through the etch stop material to a plurality of lower interconnects below the etch stop material; and
   a first sidewall spacer arranged along the first outermost sidewall of the top electrode and a second sidewall spacer arranged along the second outermost sidewall of the top electrode, as viewed in a cross-sectional view, wherein the first sidewall spacer has a different height than the second sidewall spacer.

2. The integrated chip of claim 1, wherein the memory device has a height that is in a range of between approximately 700 Angstroms and approximately 800 Angstroms.

3. The integrated chip of claim 1, wherein the bottom electrode comprises an additional upper surface directly below the data storage structure, the additional upper surface being vertically above the upper surface of the bottom electrode and laterally off-centered from a center of the bottom electrode.

4. The integrated chip of claim 1, wherein the bottom electrode extends past the second sidewall spacer.

5. The integrated chip of claim 1, further comprising:
an additional memory device having an additional bottom electrode vertically separated from an additional top electrode by way of an additional data storage structure, wherein the bottom electrode is laterally separated from the additional bottom electrode by a distance that is in a range of between approximately 2 nm and approximately 100 nm.

6. The integrated chip of claim 1,
wherein the first sidewall spacer is also arranged on an outer sidewall of the bottom electrode, wherein the first sidewall spacer has a first curved surface that meets an underlying second curved surface at a point that is laterally outside of the bottom electrode, the first curved surface and the underlying second curved surface facing away from the bottom electrode.

7. The integrated chip of claim 1,
wherein the first sidewall spacer laterally extends from directly over the bottom electrode to an outermost sidewall of the bottom electrode.

8. The integrated chip of claim 1, wherein the memory device is a resistive random access memory (RRAM) device.

9. The integrated chip of claim 1, wherein the bottom electrode extends in the first direction past a first outermost sidewall of the data storage structure to a first distance that is in a first range of between approximately 0 nanometers (nm) and approximately 60 nm.

10. The integrated chip of claim 9, wherein the bottom electrode extends in the second direction past a second outermost sidewall of the data storage structure to a second distance that is in a second range of between approximately 10 nm and approximately 100 nm, the second direction being opposite the first direction.

11. An integrated chip, comprising:
a bottom electrode arranged over a substrate;
a data storage structure disposed on the bottom electrode and configured to store a data state;
a top electrode disposed on the data storage structure;
a first interconnect via contacting an upper surface of the bottom electrode;
a second interconnect via contacting an upper surface of the top electrode;
a sidewall spacer arranged along sidewalls of the top electrode, wherein the upper surface of the bottom electrode continuous extends along a closed path around an outer boundary of the sidewall spacer;
a second sidewall spacer arranged along sidewalls of the bottom electrode; and
an etch stop layer continuously extending from along a first sidewall of the sidewall spacer to along a second sidewall of the second sidewall spacer.

12. The integrated chip of claim 11, wherein the bottom electrode has a rectangular shape as viewed from a top-view of the bottom electrode.

13. The integrated chip of claim 11,
wherein the top electrode is laterally separated from the first interconnect via along a first direction; and
wherein the bottom electrode has a first segment having a first width and a second segment having a second width that is different than the first width, the first width and the second width being measured along a second direction that is perpendicular to the first direction and parallel to the upper surface of the bottom electrode.

14. The integrated chip of claim 11, wherein the sidewall spacer has a first curved surface that meets an underlying second curved surface at a point that is laterally outside of the bottom electrode, the first curved surface and the underlying second curved surface facing away from the bottom electrode.

15. The integrated chip of claim 11, wherein the sidewall spacer continuously extends over a first height along a first side of the data storage structure and over a second height along an opposing second side of the data storage structure, the first height being different than the second height.

16. The integrated chip of claim 11, wherein the sidewall spacer comprises a first lower surface over the bottom electrode and a second lower surface that is below the first lower surface, the sidewall spacer having a sidewall that is coupled between the first lower surface and the second lower surface.

17. An integrated chip, comprising:
a bottom electrode arranged over a substrate;
a data storage structure disposed on the bottom electrode and configured to store a data state;
a top electrode disposed on the data storage structure;
a first interconnect via contacting the bottom electrode;
a second interconnect via contacting the top electrode;
a sidewall spacer arranged along sidewalls of the top electrode and having a lower surface that is over the bottom electrode, wherein the sidewall spacer has an outer sidewall that faces the first interconnect via and that is laterally separated from the first interconnect via by a non-zero distance measured along a first direction; and
wherein the sidewall spacer continuously extends from along a sidewall of the bottom electrode to over an upper surface of the bottom electrode.

18. The integrated chip of claim 17, wherein the upper surface of the bottom electrode has a first part that is laterally outside of both the sidewall spacer and the first interconnect via, the first part of the upper surface laterally extending for a second non-zero distance between the outer sidewall of the sidewall spacer and an outermost sidewall of the first interconnect via.

19. The integrated chip of claim 17, wherein the bottom electrode extends along a second direction to different distances past opposing sides of the second interconnect via, the second direction perpendicular to the first direction and parallel to the upper surface of the bottom electrode.

20. The integrated chip of claim 17, wherein the bottom electrode extends in a second direction to different distances past an outermost sidewall of the first interconnect via and past an outermost sidewall of the second interconnect via, the second direction perpendicular to the first direction and parallel to the upper surface of the bottom electrode.

* * * * *